United States Patent
Ishikawa et al.

(10) Patent No.: US 8,032,810 B2
(45) Date of Patent: Oct. 4, 2011

(54) NON-VOLATILE SEMICONDUCTOR STORAGE DEVICE AND NON-VOLATILE STORAGE SYSTEM

(75) Inventors: Tatsuyuki Ishikawa, Yokohama (JP); Mitsuaki Honma, Yokohama (JP); Hironori Uchikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1084 days.

(21) Appl. No.: 11/839,222

(22) Filed: Aug. 15, 2007

(65) Prior Publication Data
US 2008/0055990 A1    Mar. 6, 2008

(30) Foreign Application Priority Data
Aug. 31, 2006 (JP) .................. 2006-234790

(51) Int. Cl.
*H03M 13/00* (2006.01)

(52) U.S. Cl. ...................... 714/754; 714/780

(58) Field of Classification Search .......... 714/754, 714/780
See application file for complete search history.

(56) References Cited

U.S. PATENT DOCUMENTS

| | | | | |
|---|---|---|---|---|
| 4,369,510 | A | * | 1/1983 | Johnson et al. ............... 714/49 |
| 6,594,169 | B2 | | 7/2003 | Sakui |
| 7,196,860 | B2 | * | 3/2007 | Alex ............................ 360/31 |
| 7,315,915 | B2 | * | 1/2008 | Fukuda et al. ............. 711/103 |
| 7,417,900 | B2 | * | 8/2008 | Rolandi et al. ......... 365/185.25 |
| 2008/0104459 | A1 | * | 5/2008 | Uchikawa et al. ......... 714/721 |

FOREIGN PATENT DOCUMENTS

| JP | 3176019 | 4/2001 |
|---|---|---|
| JP | 2002-251884 | 9/2002 |

OTHER PUBLICATIONS

U.S. Appl. No. 12/622,868, filed Nov. 20, 2009, Sakurada.
U.S. Appl. No. 11/877,287, filed Oct. 23, 2007, Uchikawa, et al.

* cited by examiner

*Primary Examiner* — Joseph D Torres
(74) *Attorney, Agent, or Firm* — Oblon, Spivak, McClelland, Maier & Neustadt, L.L.P.

(57) ABSTRACT

This memory device comprises a word-line control circuit applying a read voltage and a soft-value read voltage as a word line voltage to a word line to generate soft-values. The soft-value read voltage is between an upper limit and a lower limit of each of plural threshold voltage distributions. A likelihood calculation circuit calculates a likelihood value of data stored in a memory cell based on the soft-value. An error correction circuit executes data error correction for the data read from the memory cell based on the likelihood value. A refresh control circuit controls a timing of a refresh operation for the memory cell based on the soft-value or the likelihood value.

14 Claims, 19 Drawing Sheets

MEMORY CELL MC

SELECTION GATE S1, S2

LOWER PAGE READ OPERATION

UPPER PAGE READ OPERATION

NON-VOLATILE SEMICONDUCTOR STORAGE DEVICE AND NON-VOLATILE STORAGE SYSTEM

CROSS REFERENCE TO RELATED APPLICATIONS

This application is based on and claims the benefit of priority from prior Japanese Patent Application No. 2006-234790, filed on August 31, the entire contents of which are incorporated herein by reference.

BACKGROUND OF THE INVENTION

1. Field of the Invention

The present invention relates to a non-volatile semiconductor storage device and a non-volatile semiconductor storage system, and particularly, to a non-volatile semiconductor storage device and a system with a refresh function of memory cells to improve reliability of data.

2. Description of the Related Art

One of the well-known non-volatile semiconductor storage devices is a NAND cell type flash memory. The NAND cell type flash memory includes a memory cell array including a plurality of NAND cell units. Each NAND cell unit includes a plurality of memory cells connected in series and two selection transistors connected to both ends thereof. The memory cell holds, in an erase state, data "1" having a negative threshold voltage. In a data write operation, a floating gate is injected with electrons to rewrite data "0" having a positive threshold voltage. The NAND cell type flash memory may change the threshold voltage only from a lower value to a higher value in a data write operation, and may change the threshold voltage in the reverse direction (from a higher value to a lower value) only by an erase operation per a block.

However, a probability of fail bit occurrence in a memory cell array is increasing greatly, as the memory cell is miniaturized, thus lowering the yield of non-volatile memory chips. In considering this situation, a memory with an error correction circuit using an error correction code (ECC) in order to guarantee data reliability of a memory cell has been proposed (for example, see Patent Document 1: JP 2002-251884 (Paragraph 0026-0030 etc.))

Moreover, a technology for performing a refresh operation is also known (for example, see Patent Documents 2: JP 3176019 B1). The refresh operation to stored data is accomplished by performing periodical data rewrite, performing data rewrite to other areas, an additional write-verify operation or the like, in order to lowering a fail-bit occurrence rate.

Performing a refresh operation in all memory areas results in a long time for finishing a refresh operation. In addition, it might give an unnecessary stress to areas with a small amount of fail bits. Accordingly, in the technology disclosed in the Patent Document 2, a number (a number of times) of error corrections conducted is fed back from an error-correction circuit, and a refresh operation is carried out only in areas where a number of error corrections conducted is close to a limit correctable by an error correction code.

An error-correction circuit using iterative decoding method with soft-decision information as an input (a decoder circuit with an LDPC code or the like) has a splendid error correction ability. However, it does not count the number of errors corrected. Moreover, in an error-correction process using iterative decoding method based on soft-decision information, it is difficult to judge whether the number of error corrections conducted is close to a limit correctable by an error correction code.

SUMMARY OF THE INVENTION

In One aspect the present invention provides a non-volatile semiconductor memory device comprising: a memory cell array comprising a plurality of memory cells enabled to store multi-value data by differences of threshold voltages, the memory cells being arranged along a plurality of bit-lines and a plurality of word-lines; a sense amplifier circuit connected to the bit-lines; a word-line control circuit controlling applying a read voltage as a word line voltage to the word line, the read voltage being larger than an upper limit of one of plural threshold voltage distributions representing the data and smaller than a lower limit of another threshold voltage distribution with higher threshold voltages than the one of the plural threshold voltage distributions, and applying a soft-value read voltage as a word line voltage to the word line, the soft-value read voltage being smaller than an upper limit of each of the plurality of the threshold voltage distributions and larger than a lower limit thereof to generate a plurality of soft-values; a likelihood calculation circuit calculating a likelihood value of data stored in the memory cell based on the soft-value; an error correction circuit executing data error correction for the data read from the memory cell based on the likelihood value; and a refresh control circuit controlling a timing of a refresh operation for the memory cell based on the soft-value and the likelihood value.

In One aspect the present invention provides a non-volatile semiconductor memory device comprising: a likelihood calculation circuit calculating a likelihood value of data stored in a memory cell in a memory cell array based on the soft-value read therefrom, the memory cell array comprising a plurality of the memory cells enabled to store multi-value data by differences of threshold voltages, the memory cells being arranged along a plurality of bit-lines and a plurality of word-lines; an error correction circuit executing data error correction for the data read from the memory cell based on the likelihood value; and a refresh control circuit controlling a timing of a refresh operation for the memory cell based on the soft-value or the likelihood value.

DETAILED DESCRIPTION OF THE EMBODIMENTS

With reference to the accompanying drawings, preferred embodiments of the present invention will be described in more detail with respect to an example of a four-value NAND cell type flash memory.

[Basic Principle]

Figure 1:
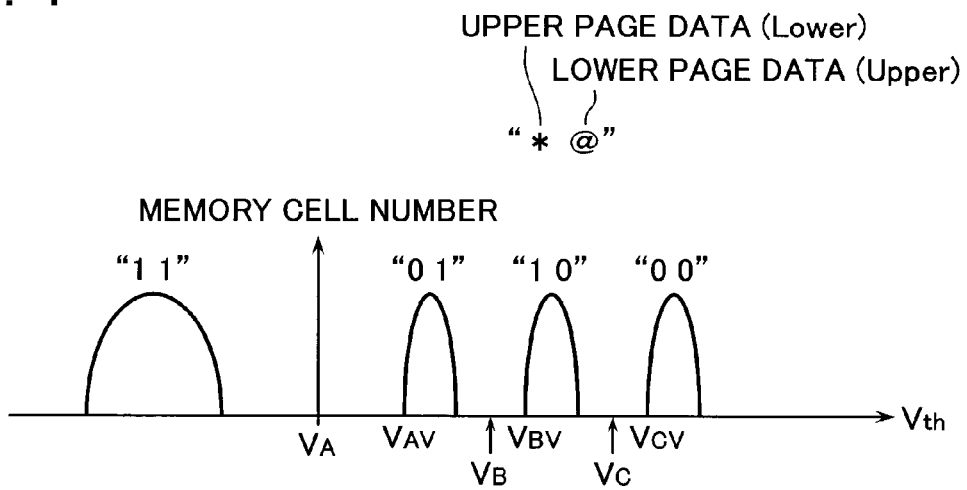
FIG. 1 shows an example of write data in a four-value storage flash memory.

A four-value NAND cell type flash memory is adapted to allow its one memory cell to have a threshold voltage having four types of distributions. FIG. 1 shows two-bit, four-value data (data "11," "10," "01," and "00") stored in a memory cell of the four-value NAND cell type flash memory and a distribution of a threshold voltages (Vth) of a memory cell. Note that in FIG. 1, VA, VB, and VC are voltages applied to selected word-lines when reading four sets of data, and VAv, VBv, and VCv indicate verify voltages.

A memory cell after a block erasure is indicated as data "11." The memory cell has a negative threshold voltage Vth. Memory cells containing data "01," "10," and "00" in a write state have a positive threshold voltage Vth. The data "01" in a write state has the lowest threshold voltage. The data "00" has the highest threshold voltage. The data "10" has a threshold voltage between the voltages of data "01" and data "00."

The two-bit data in one memory cell includes lower page data and upper page data. The lower and upper page data are written to the memory cell by different write operations, specifically, by two write operations. In an expression of data "*@, "*" indicates the upper page data, and "@" indicates the lower page data.

The lower page data write operation is first described with reference to FIG. 2. It is assumed that all memory cells are in an erase state, i.e., they have data "11." Referring to FIG. 2, when the lower page data is written, the threshold voltage Vth of the memory cell is divided into two distributions depending on the lower page data ("1" or "0"). When, specifically, the lower page data is "1," the tunnel oxide layer of the memory cell is not applied with a high electric field, thus suppressing increase of the threshold voltage Vth of the memory cell. The memory cell thus maintains the erase state data (data "11").

When the lower page data is "0," the tunnel oxide layer of the memory cell is applied with a high electric field to inject electrons to the floating gate electrode. The threshold voltage Vth of the memory cell is thus increased by a predetermined amount. Specifically, the verify potential VBv' is set, and the write operation is repeated until the threshold voltage equals the verify potential VBv' or more. The memory cell thus changes to the write state (data "10"). Note that the data "10" has a wider threshold voltage distribution than that of the data "11" because the write operation affects the adjacent cells.

The upper page data write operation is now described with reference to FIG. 3. The upper page data is written according to write data (upper page data) input from outside the chip and lower page data already written to the memory cell.

Figure 3:
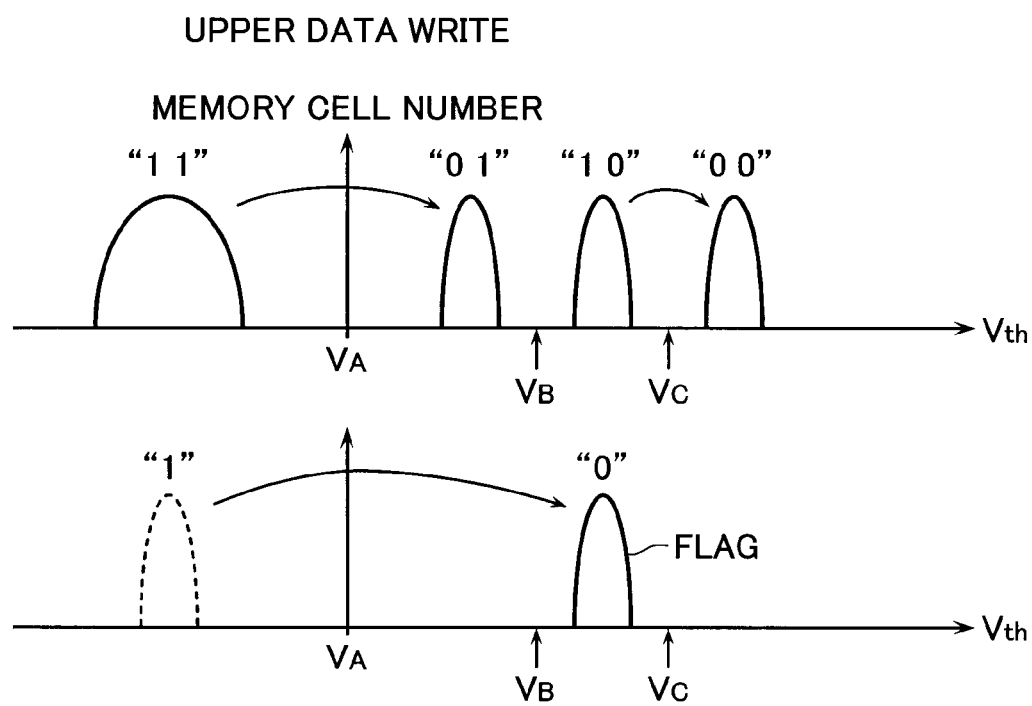
FIG. 3 is another schematic diagram of a data write process in a four-value storage flash memory.

Referring to FIG. 3, specifically, when the upper page data is "1," the tunnel oxide layer of the memory cell is not applied with a high electric field, thus suppressing increase of the threshold voltage Vth of the memory cell. The memory cell of data "11" (erase state) thus maintains the data "11", and the memory cell of data "01" maintains the data "01."

When the upper page data is "0," the tunnel oxide layer of the memory cell is applied with a high electric field to inject electrons to the floating gate electrode. The threshold voltage Vth of the memory cell is thus increased by a predetermined amount. The memory cell of data "11" (erase state) thus changes to data "01," and the memory cell of data "10" changes to data "00."

The above operations may be summarized as follows.

(1) When the lower page data is "1" and the upper page data is "1," the erase state cell maintains the data "11."
(2) When the lower page data is "0" and the upper page data is "1," the data "10" is written to the memory cell.
(3) When the lower page data is "1" and the upper page data is "0," the data "01" is written to the memory cell.
(4) When the lower page data is "0" and the upper page data is "0," the data "00" is written to the memory cell.
(5) The write operations of (1) to (4) each include two write operations: the first lower page data write operation and the subsequent higher page data write operation.

It is necessary to store, in any storage means, data indicating whether the memory cell MC is at the stage where the lower page data write operation has been ended and the upper page data write operation has not been ended yet, or at the stage where the lower page data write operation has been ended and the upper page data write operation also has been ended. This is indicated by flag data FLAG stored in a memory cell (flag cell) similar to a memory cell that stores data. Referring to FIGS. 2 and 3, when the memory cell is at the former stage, the flag data FLAG is "1" (a negative threshold voltage), and when the memory cell is at the latter stage, the flag data FLAG is "0" (a threshold voltage of VB or more).

[Memory Configuration]

Figure 4:
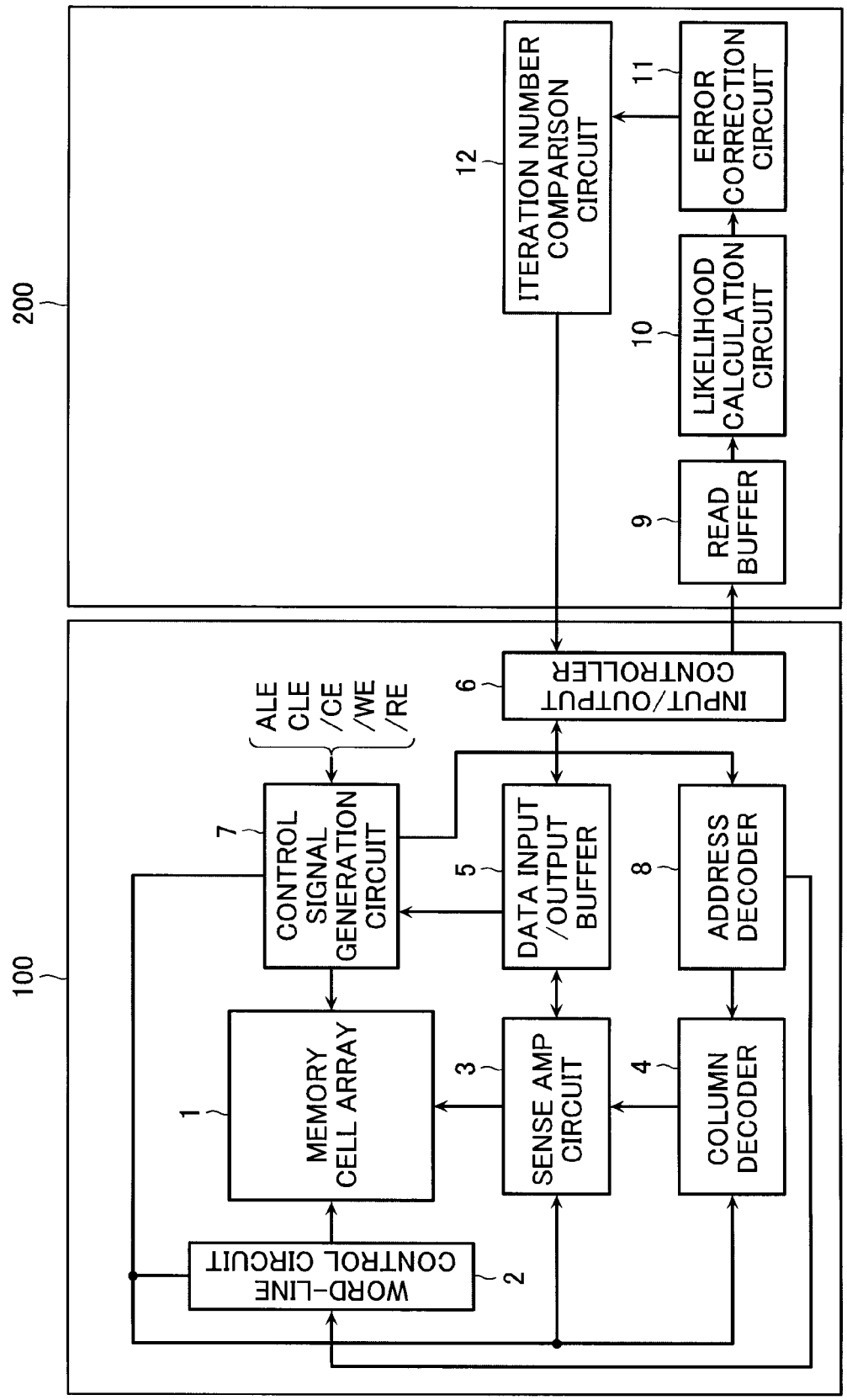
FIG. 4 is a schematic diagram of a configuration of a NAND cell type flash memory according to a first embodiment of the present invention.

FIG. 4 shows, as an example of a non-volatile semiconductor storage device, a configuration of a NAND cell type flash memory that stores four-value (two-bit) data.

This NAND cell type flash memory includes a memory unit 100 and a controller 200 to control the memory unit 100.

The memory unit 100 includes a memory cell array 1. The array 1 includes memory cells that store data. The memory cells are arranged in a matrix.

The memory cell array 1 includes a plurality of bit-lines, a plurality of word-lines, and a common source line. The array 1 includes memory cells that may electrically rewrite data. The memory cells are arranged in a matrix at the intersection points of the bit-lines and the word-lines. This memory cell may store multi-value data as information bit, as well as redundant data attached to the information bit for error correction, and the flag data.

Connected to the memory cell array 1 are a word-line control circuit 2 to control the word-line voltage, and a sense amplifier circuit 3. The word-line control circuit 2 selects word lines and controls the word-line voltage according to an address signal decoded by an address decoder 8. The sense amplifier circuit 3 serves as a sense amplifier sensing and amplifying a signal based on data stored in the memory cell in the memory cell array 1 via the bit line. In addition, it serves as a latch circuit with a data latch function retaining read data and write data.

The sense amplifier circuit 3 is connected to a column decoder 4, a data input-output buffer 5 and an I/O control circuit 6. The column decoder 4 has a function of selecting a bit line according an address signal decoded by the address decoder 8.

The data input-output buffer 5 has a function of temporarily retaining input/output data to and from the sense amplifier circuit 3.

The I/O control circuit 6 manages the input/output control of the data.

The data of the memory cell read from the memory cell array 1 is output to external through the sense amplifier circuit 3, the data input-output buffer 5, and I/O control circuit 6. Moreover, the write data input to the data input-output buffer 5 from external is latched at the sense amplifier circuit 3 through the data input-output buffer 5, and is written in the memory cell specified.

Moreover, the memory cell array 1, the word-line controlling circuit 2, the sense amplifier circuit 3, the column decoder 4, and the address decoder 8 are connected to a control signal generation circuit 7. The control signal generation circuit 7 generates control signals and control voltages for controlling the memory cell array 1, the word-line control circuit 2, the sense-amplifier circuit 3, the column decoder 4 and the address decoder 8, according to control signals (a chip-enable signal /CE, a write enable signal /WE, a read enable signal /RE, an address-latch-enable signal ALE, a command latch enable signal CLE and the like) input to the control signal input terminals not shown.

The word-line controlling circuit 2 in this embodiment applies, on read operation, plural-bit-data read voltages (in FIG. 1, VA, VB, VC) and verify voltages (in FIG. 1, VAV, VBV, VCV) to the word-lines WL as word-line voltages. The plural-bit-data read voltages are between the upper limit in one of the four threshold voltage distributions (FIG. 1) representing the four data and the lower limit of another threshold voltage distribution with a larger value.

In addition, the word line control circuit 2 performs control of applying plural kinds of voltages (soft-value read voltage) to the word lines WL as word-line voltages. The soft-value read voltage is between the upper limit and the lower limit in one of the four threshold value distributions, for generating soft-values as described later in detail. Note that "an upper limit" and "a lower limit" herein means an upper limit and a lower limit of a threshold voltage distribution immediately after data write operation to the memory cells. The upper limit and the lower limit do not overlap other threshold value distributions.

Moreover, the controller 200 comprises a read buffer 9, a likelihood calculation circuit 10, an error correction circuit 11, and a iteration number comparator circuit 12. The read buffer 9 temporarily holds the soft-value data for every memory cell output from the memory unit 100 through the I/O control circuit 6. In addition, the normal bit data obtained by applying a bit-data read voltage is output outside from I/O pads not illustrated.

The likelihood calculation circuit 10 calculates a likelihood value of plural bit data stored in each memory cell (when a memory cell stores four value data, likelihood values of 2-bit data per each cell), based on the soft-value data of each memory cell held at the read buffer 9.

A Likelihood value is a value representing a certainty of information of each bit. In this embodiment, a likelihood value shall be calculated as a logarithm of a ratio of Pr (0) to Pr(1)(log(Pr(0)/Pr(1))), where Pr(1) denotes a probability that the data is "1", and Pr(0) denotes a probability that the data is "0". An example of the likelihood calculation circuit 10 has a likelihood table (not shown) storing soft-value data and likelihood values linked to each other. A Likelihood value may be judged and output by referring to this table.

The error-correction circuit 11 has a function of performing a iterative decoding process (for example, a LDPC code decoding process or the like) in which a decoding process is repeatedly performed to obtain an error-correction result. In the error correction circuit 11, a iterative decoding processing is performed based on the likelihood value of every input bit to perform an error correction.

The iteration number comparator circuit 12 is an example of a refresh controlling circuit controlling a refresh operation of a memory cell. When a iterative decoding processing is completed in this error-correction circuit 11, the iteration number comparator circuit compares the iteration number data which is output from the error-correction circuit 11, with a reference value.

When the iteration number is larger than the reference value, the iteration number comparator circuit 12 judges that a number of error corrections conducted is close to a limit correctable by an error correction code. Then, it outputs a refresh command to the memory area where an error correction is performed (in other words, an area read most recently).

Figure 5:
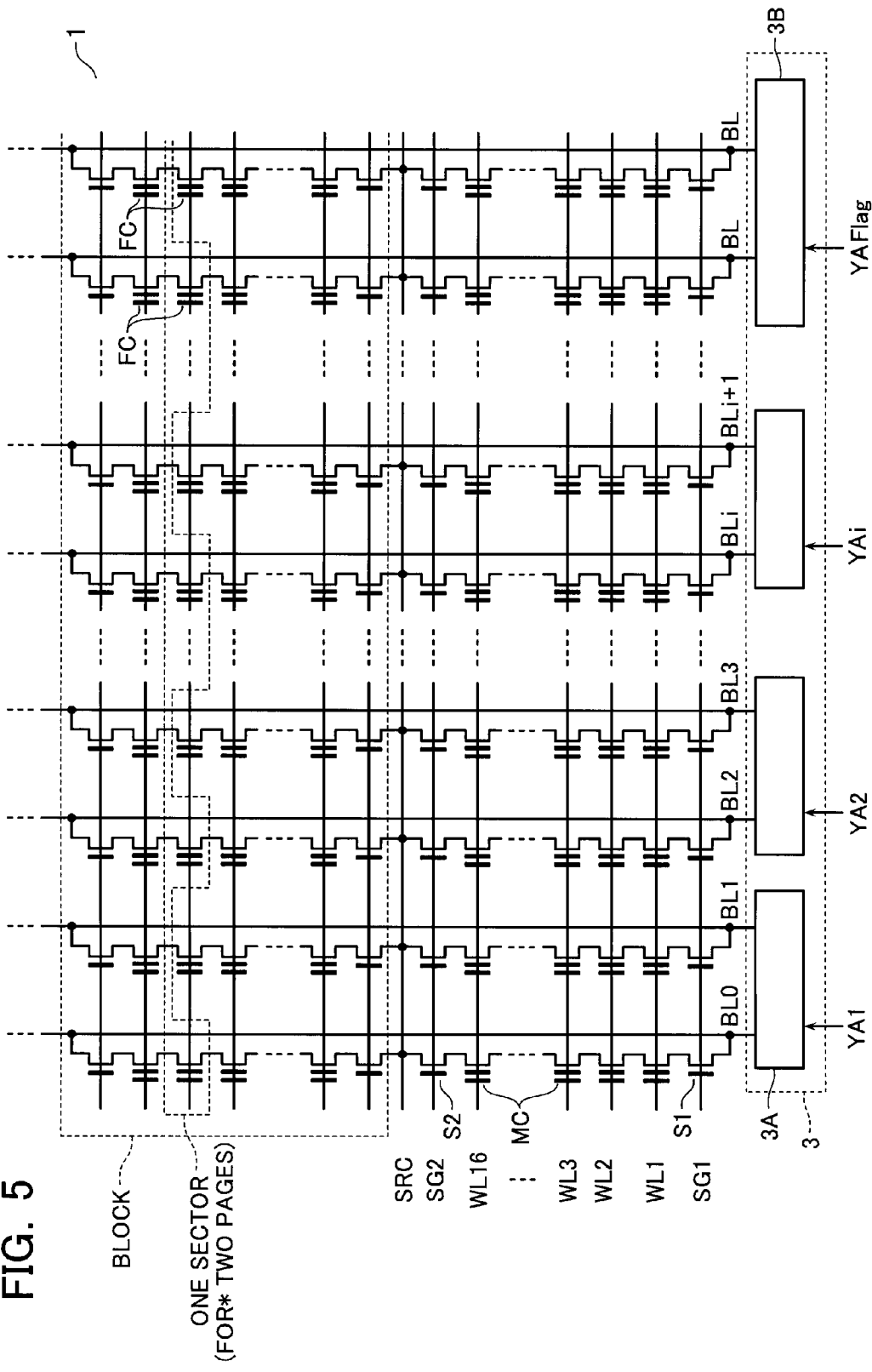
FIG. 5 is a circuit diagram of a configuration of the memory cell array 1 and the sense amplifier circuit 3 in FIG. 4.

FIG. 5 shows a structure of the memory cell array 1 shown in FIG. 1, and the sense-amplifier circuit 3. One NAND cell includes memory cells MC comprising, for example, 16 EEPROMs connected in series and selection gates S1 and S2 connected to both ends thereof.

The selection gate S1 is connected to a bit-line BL0. The selection gate S2 is connected to a source line SRC.

The memory cell MCs arranged on the same row have control gates that is commonly connected to word-lines WL1, WL2, and WL3 to WL16. The first selection gates S1 is commonly connected to a select line SG1. The second selection gates S2 is commonly connected to a select line SG2.

The memory cell array 1 includes, as shown by a broken line, a plurality of blocks. Each block includes a plurality of NAND cells. Data is erased per a block. The erase operation is performed at the same time on two bit-lines connected to a data storage circuit 3A or a flag data storage circuit 3B.

The sense amplifier circuit 3 includes a plurality of the data storage circuits 3A and the flag data storage circuit 3B. Connected to the data storage circuits 3A and the flag data storage circuit 3B are respective pairs of bit-lines (BL0 and BL1), (BL2 and BL3) . . . (BLi and BLi+1), and (BL and BL).

Each data storage circuit 3A has a function of holding data read from the memory cell MC. The data storage circuit 3A also has a function of holding data to be written to the memory cell MC. The storage circuit 3A also serves to operate internal data when plural-bit data write and plural-bit data read is performed, as described below, and when soft-value data is generated, as described below.

A plurality of memory cells (enclosed by a broken line) form one sector. The memory cells in one sector are arranged on every other bit-line and are connected to one word-line. Data is written to and read from each sector. One sector stores, for example, two-page data. Connected to each word-line is a flag cell FC to store the flag data FLAG. The flag cell FC stores the flag data FLAG. The flag data FLAG is "1" when the lower page data write operation has been ended in the memory cell MC. The flag data FLAG is "0" when the upper page data write operation has been ended.

In a read operation, a program verify operation, and a program operation, one bit-line is selected from the two bit-lines (BLi and BLi+1) connected to the data storage circuit 3A according to the address signal (YA1, YA2, ..., YAi, and YAflag) specified from the outside. Also, according to the external address, one word-line is selected and one sector (for two pages) is selected. Switching between the two pages is performed according to the address.

Figure 6:
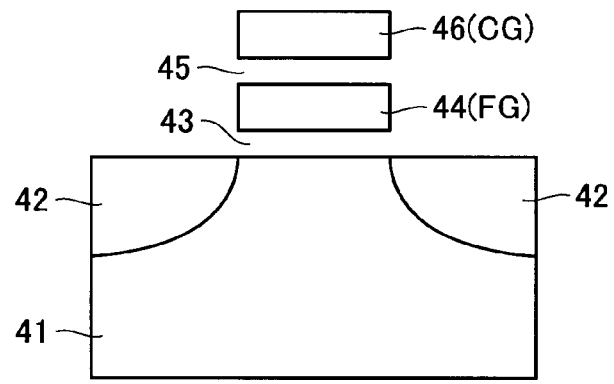
FIG. 6 is a cross sectional view of the memory cell MC in FIG. 5.
Figure 7:
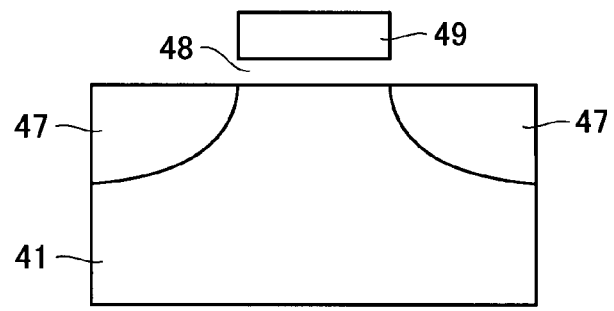
FIG. 7 is a cross sectional view of the selection gates S1 and S2 in FIG. 5.

FIGS. 6 and 7 show cross-section structures of the memory cell MC and the selection gates S1 and S2. FIG. 6 shows a cross-section structure of the memory cell MC. The substrate 41 has n-type diffusion layers 42 formed therein. The diffusion layers 42 function as a source and a drain of MOSFET included in the memory cell MC, respectively. The substrate 41 also has a floating gate (FG) 44 formed thereon via a gate-insulating layer 43. The floating gate 44 has a control gate (CG) 46 formed thereon via the insulating layer 45.

The selection gates S1 and S2 each include a substrate 41 and n-type diffusion layers 47 formed in the substrate 41. The diffusion layers 47 serve as a source and a drain, respectively. The substrate 41 has a control gate 49 formed thereon via a gate-insulating layer 48.

Figure 8:
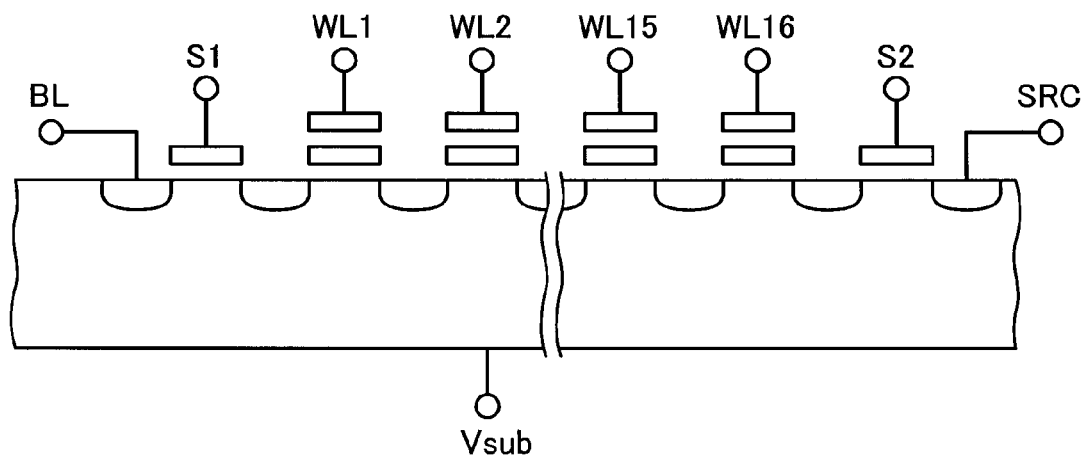
FIG. 8 is a cross sectional view of one NAND cell in a memory cell array.

FIG. 8 shows a cross section of one NAND cell in the memory cell array. In this example, the one NAND cell includes 16 memory cells MC connected in series, each having a configuration in FIG. 6. The NAND cell includes, on its drain side and source side, the first selection gates S1 and S2 each having a configuration in FIG. 7.

FIG. 8 shows a cross section of one NAND cell in the memory cell array. In this example, the one NAND cell includes 16 memory cells MC connected in series, each having a configuration in FIG. 6. The NAND cell includes, on its drain side and source side, the first selection gates S1 and S2 each having a configuration in FIG. 7.

Figure 9:
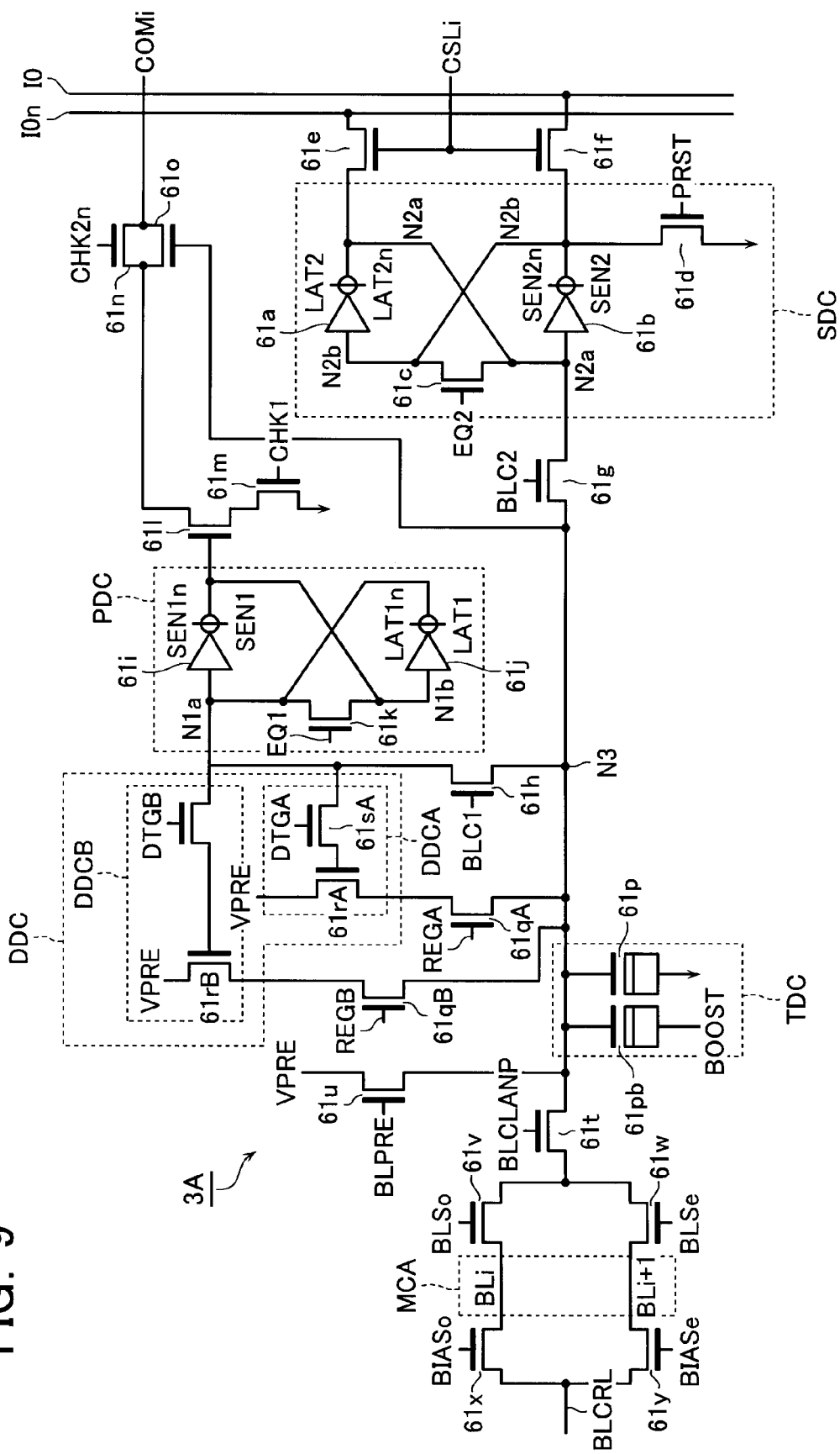
FIG. 9 is a circuit diagram of an example configuration of the data storage circuit in FIG. 5.

An example configuration of the data storage circuit 3A is described below with reference to FIG. 9. Note that the data storage circuit 3B has a similar configuration to the circuit 3A, so its description is omitted here. The data storage circuit 3A includes a primary data cache (PDC), a secondary data cache (SDC), a dynamic data cache (DDC), and a temporary data cache (TDC).

The SDC, PDC, and DDC hold input data in a write operation, hold read data in a read operation, temporarily hold data in a verify operation, and are responsible for data storage to operate internal data in multi-value data storage. The TDC amplifies bit-line data and temporarily holds the data in a data read operation. The TDC is also used to operate internal data in multi-value data storage.

The SDC includes clocked inverter circuits 61a and 61b and transistors 61c and 61d. The inverter circuits 61a and 61b make up a latch circuit. The transistor 61c is connected between the input terminals of the clocked inverter circuits 61a and 61b. The transistor 61c receives at its gate a signal EQ2.

The transistor 61d is connected between the output terminal of the clocked inverter circuit 61b and the ground. The transistor 61d receives at its gate a signal PRST.

The SDC has a node N2a (the output terminal of the clocked inverter circuit 61a). The node N2a is connected, via a column selection transistor 61e, to an input-output data line IOn. The SDC also has a node N2b (the output terminal of the clocked inverter circuit 61b). The node N2b is connected, via a column selection transistor 61f, to an input-output data line IO. The column selection transistors 61e and 61f receive at their gates a column selection signal CSLi.

The PDC includes clocked inverter circuits 61i and 61j and a transistor 61k. The inverter circuits 61i and 61j make up a latch circuit. The transistor 61k is connected between the input terminals of the clocked inverter circuits 61i and 61j. The transistor 61k receives at its gate a signal EQ1. A node N1a of the PDC and the node N2a of the SDC are connected via transistors 61g and 61h. The transistor 61g receives at its gate a signal BLC2. The transistor 61h receives at its gate a signal BLC1.

The PDC also has a node N1b (the input terminal of the clocked inverter circuit 61j). The node N1b is connected to the gate of a transistor 61l. The current path of the transistor 61l has one end grounded via a transistor 61m. The transistor 61m receives at its gate a signal CHK1. The current path of the transistor 61l has the other end connected to one ends of the current paths of transistors 61n and 61o both making up a transfer gate. The transistor 61n receives at its gate a signal CHK2n. The gate of the transistor 61o is connected to a connection node between the transistors 61g and 61h.

The current paths of the transistors 61n and 61o have the other ends supplied with a signal COMi. The signal COMi is a signal common to all data storage circuits 10. The signal COMi indicates whether verification of all data storage circuits 10 is complete. After the verification is complete, the node N1b of the PDC changes to "L," as described below. In this condition, changing the signals CHK1 and CHK2n to "H," causes the signal COMi to become "H", if the verification is complete.

The TDC includes, for example, a MOS capacitor 61p. The MOS capacitor 61p is connected between the ground and a connection node N3 between the transistors 61g and 61h. Connected to the connection node N3, via a transistor 61q, is the DDC. The transistor 61q receives at its gate a signal REG.

The DDC includes transistors 61r and 61s. The current path of the transistor 61r has one end supplied with a signal VREG. The current path has the other end connected to the current path of the transistor 61q. The gate of the transistor 61r is connected via the transistor 61s to the node N1a of PDC. The transistor 61s receives at its gate a signal DTG.

Also connected to the connection node N3 are one ends of the current paths of transistors 61t and 61u. The current path of the transistor 61u has the other end supplied with a signal VPRE. The transistor 61u receives at its gate a signal BLPRE.

The transistor 61t receives at its gate a signal BLCLAMP. The current path of the transistor 61t has the other end connected via a transistor 61v to a bit-line BLi. The other end is also connected via a transistor 61w to a bit-line BLi+1.

The bit-line BLi has the other end connected to one end of the current path of a transistor 61x. The transistor 61x receives at its gate a signal BlASo. The bit-line BLi+1 has the other end connected to one end of the current path of a transistor 61y. The transistor 61y receives at its gate a signal BlASe. The current paths of the transistors 61x and 61y have the other ends supplied with a signal BLCRL. The transistor 61x and 61y turn on, according to the signals BlASo and BlASe, in a complementary manner with the transistors 61v and 61w. The transistor 61x and 61y supply the unselected bit-line with the potential of the signal BLCRL.

[Write Operation and Verify Operation]

The multi-value write operation and the write verify operation in the NAND cell type flash memory is described with reference to FIGS. 10 and 11. The write operation is performed in two stages: the lower page data write operation and the upper page data write operation.

Figure 10:
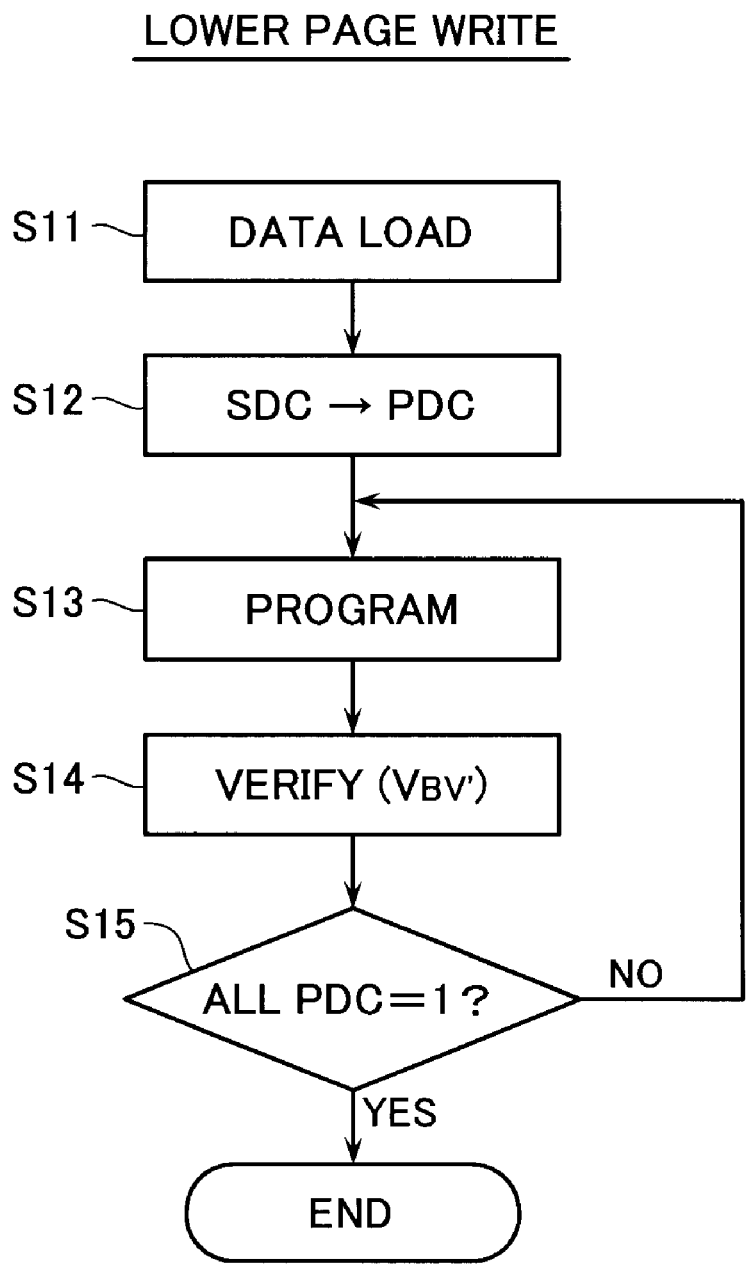
FIG. 10 is a flowchart of a write process of lower page data included in four-value data.
Figure 11:
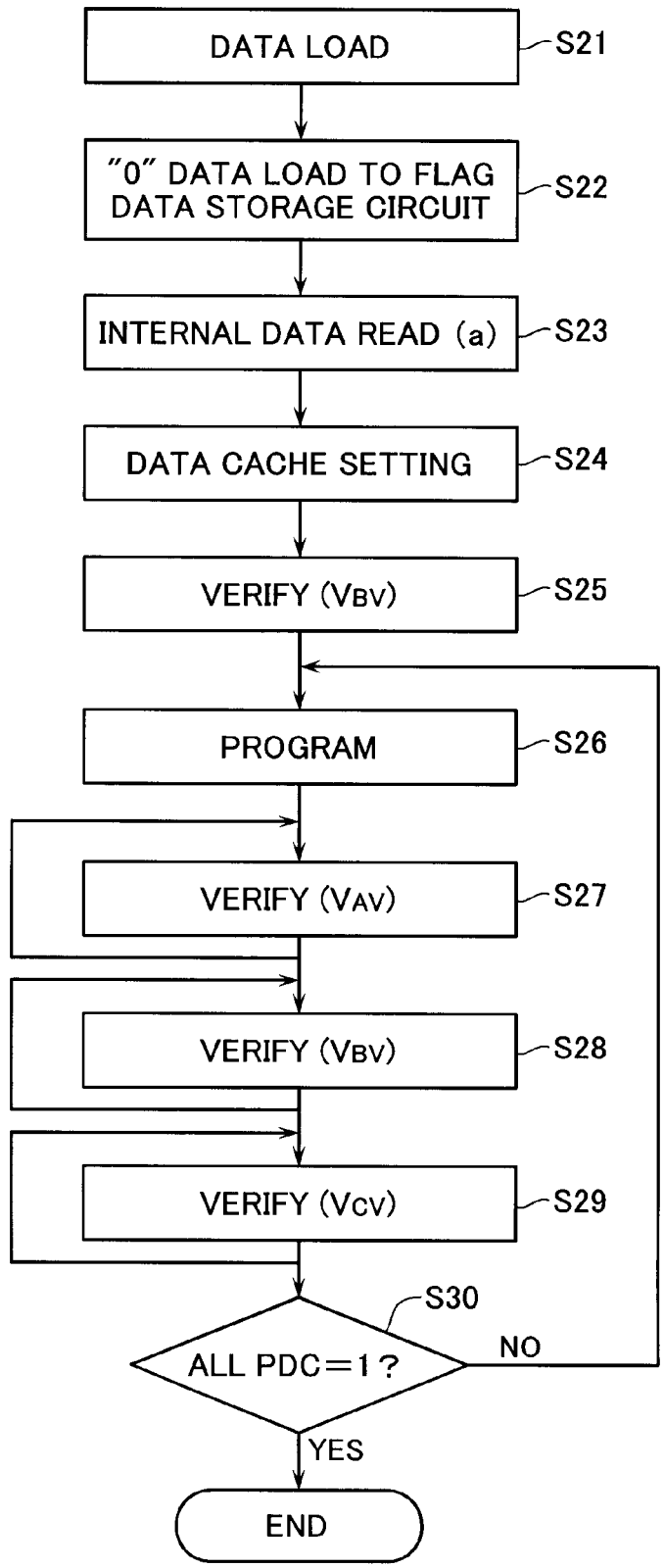
FIG. 11 is a flowchart of a write process of upper page data included in four-value data.

Referring to FIG. 10, first, to select a lower page of one sector in FIG. 5, an address is assigned, and write data is input from the outside and stored in the SDC in all data storage circuits 10 (S11).

A write command input may turn on the transistors 61h and 61g, thus transferring data of the SDC to the PDC in all data storage circuits 10 (S12). When data "1" is input from the outside as the lower page data, the node N1a of the PDC changes to "H." When data "0" is input, the node N1a of the PDC changes to "L." Note that in the lower page data write operation, no data is written to the flag cell FC. The PDC in the flag data storage circuit 3B thus has data "1."

The operation then shifts to a memory cell MC write (program) operation (S13). Specifically, the transistors 61h, "1", and 61v or 61w turn on, thus supplying data held in the PDC to the bit-line BLi or BLi+1. When the PDC holds data "1", the bit-line changes to Vdd. When the PDC holds data "0," the bit-line changes to Vss (ground potential). To avoid the unselected page cells from being written, the unselected page bit-lines are also supplied with Vdd.

The select line SG1 of the selected block is applied with Vdd. The word-line of the selected cell is applied with a potential VPGM (20V). The word-line of the unselected cell is applied with a potential VPASS (10V). This allows the write operation to the selected cells and avoids the write operation to the unselected cells.

The operation then shifts to a write verify operation (S14). First, the unselected word-line and the select line SG1 are provided with a potential Vread for a read operation, and the bit-line is precharged to 1V. The selected word-line is provided with the verify potential VBv'. The select line SG2 on the source side of the memory cell is changed to "H." When the selected memory cell MC has a threshold voltage higher than the verify potential VBv', the memory cell MC maintains the off state, thus leaving the bit-line "H." When the selected memory cell MC has a threshold voltage lower than the verify potential VBv', the memory cell MC turns on, thus changing the bit-line to "L." The node N3 of the TDC changes to "L" when the bit-line is "L." The node N3 changes to "H" when the bit-line is "H."

When the DDC is written with "0," it stores "L." When the DDC is not written with "0," it stores "H." When the signal VREG is set to Vdd and the signal REG is set to "H," the node N3 of the TDC is forced to be "H" only when the DDC is not written with "0." Then the PDC's data is transferred to the DDC, and the TDC's potential is transferred to the PDC.

Under the above operations, when the PDC is "L," the write operation is performed again, and the program operation and the verify operation are repeated until all data storage circuits 10 have data "H" (S15-S13). When thereafter the adjacent memory cells are written sequentially, the threshold voltage of the memory cell rises depending on the write data due to the FG to FG capacitance, thus spreading the threshold voltage distribution of the data "10" toward the higher direction.

The upper page data write (program) operation is now described with reference to FIG. 11. Also in the upper page data write operation, an address is first assigned, and then write data is input from the outside and stored in the SDC in all data storage circuits 10 (S21).

When, thereafter, the write command is input, the data "0" is written to the flag cell FC as the flag data FLAG, and the data "0" is input to the SDC in the flag cell data storage circuit 3B (S22).

The internal data is then read to determine whether data after the upper page is written is "11" (the lower page data is "1") or "10" (the lower page data is "0") (S23). The selected word-line is supplied with the potential VA (FIG. 1). The unselected word-line and the select line SG1 are supplied with the potential Vread.

When the memory cell has data of "10," the PDC latches "H." When the memory cell has data of "11," the PDC latches "L."

Thereafter, depending on whether data to be written is "11," "01," "10," or "00," data to be stored in each data cache SDC, PDC, TDC, or DDC is set (S24).

Then, before the write operation, the data "10" is verified (S25). Subsequently, similar to the lower page data write operation, the write operation is performed (S26).

Further, for the data "01," "10," and "00," the potential is set to VAv, VBv, and VCv, and the data is verified (S27 to S29). Until the PDC in all data storage circuits 10 has data of "H," the write and verify operations are repeated (S30).

[Read Operation]

The read operation is now described with respect to the lower page data read and the upper page data read.

Figure 12:
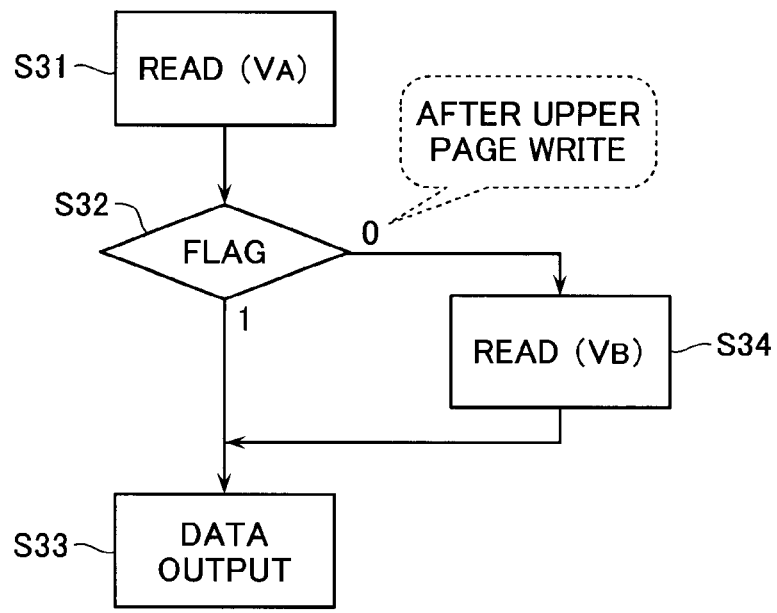
FIG. 12 is a flowchart of a read process of lower page data in four-value data.

FIG. 12 shows a flowchart of the process of the lower page data read. First, an address is assigned to select one sector in FIG. 5. Then, the potential of the selected word-line is set to VA and the read operation is performed (S31), thus determining whether the flag cell FC has flag data FLAG of "0" or "1" (S32).

Figure 2:
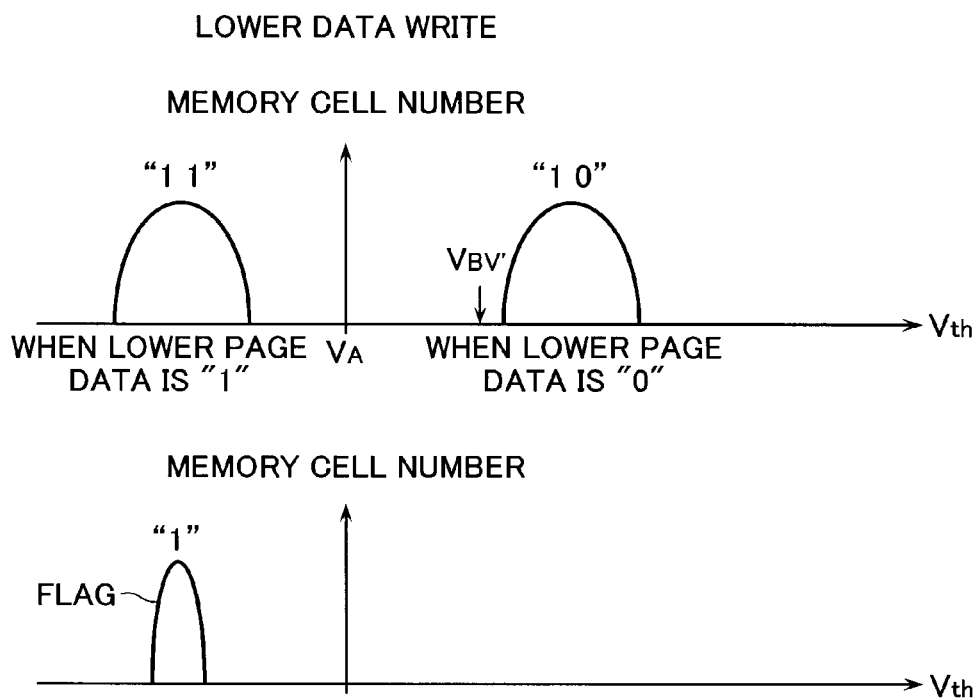
FIG. 2 is a schematic diagram of a data write process in a four-value storage flash memory.

When the flag data FLAG read from the flag cell FC is "1," the upper page data write operation is not complete, and the memory cell MC has a threshold voltage distribution as shown in FIG. 2. The data may be read with the word-line potential being set to VA. The data is thus already read to the data storage circuit 3A. Therefore, the data stored in the data storage circuit 3A is output outside for reading (S33).

When the flag data FLAG read from the flag cell FC is "0" (the memory cell has data of "1"), the upper page data write operation is complete, so the memory cell MC has a threshold voltage distribution as shown in FIG. 3. Therefore, the word-line potential is set to VB and the read operation is performed (S34), and the data read to the data storage circuit 3A is output outside (S33). Each data cache in the data storage circuit 3A then has an operation similar to those in the write and verify operations.

Figure 13:
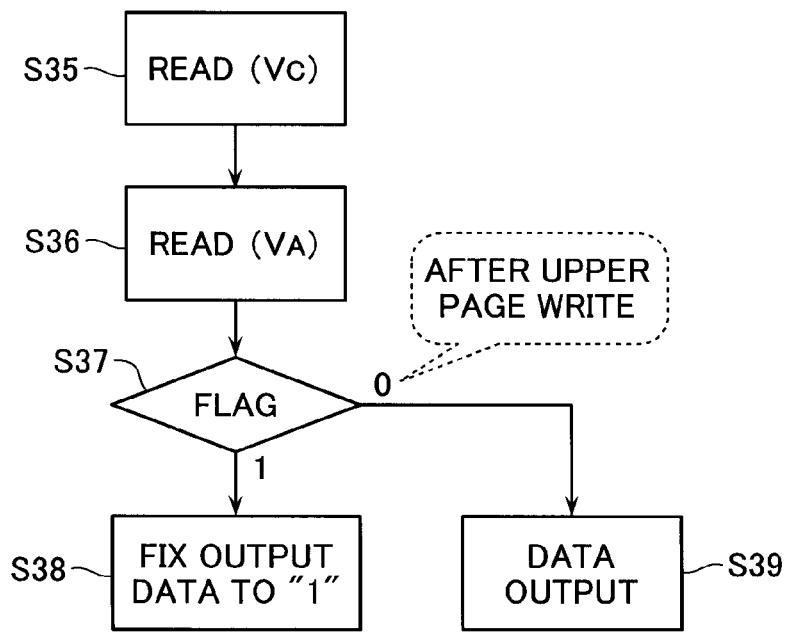
FIG. 13 is a flowchart of a read process of upper page data in four-value data.

The process of the upper page data read operation is described with respect to the flowchart in FIG. 13. In the upper page data read operation, an address is first assigned to select one sector in FIG. 5. Then the word-line potential is set to VC and the read operation is performed (S35). Then the word-line potential is set to VA and the read operation is performed (S36). Then it is determined whether the flag cell FC has flag data FLAG of "0" or "1" (S37).

As a result of this, when the flag data FLAG of the flag cell FC is "1", and the upper page write has not been performed yet, the output data is fixed to "1" (S38). In order to set an output to "1", the signal PRST of the data storage circuit 3A is set at "H", and SDC is set at "1." Alternatively, the data input-and-output buffer 4 is forced to output data "1" only.

Moreover, when the flag data FLAG of the flag cell FC is "0", the upper page data Upper is read based on the data Upper (pre1) held at DDCA, and the data Upper (pre2) newly read (S39).

An operation of the data storage circuit 3A in this read operation is explained below in detail.

The newly read data Upper (pre2) is held at TDC. At the same time the signal REGA of the gate of the transistor 61qA is set at "H" when VPRE is set at a ground potential. In this case, when the data Upper (pre1) held at DDCA is "0", i.e., the potential of the transistor 61rA's gate is "H", the voltage of the node N3 is discharged. On the other hand, when the data Upper (pre1) held at DDCA is "1", i.e., the potential of the transistor 61rA's gate is "L", the voltage of the node N3 does not change. That is, when the data Upper (pre1) held at DDCA is "0", the new data Upper (pre2) is compulsorily reversed to "1."

Figure 14:
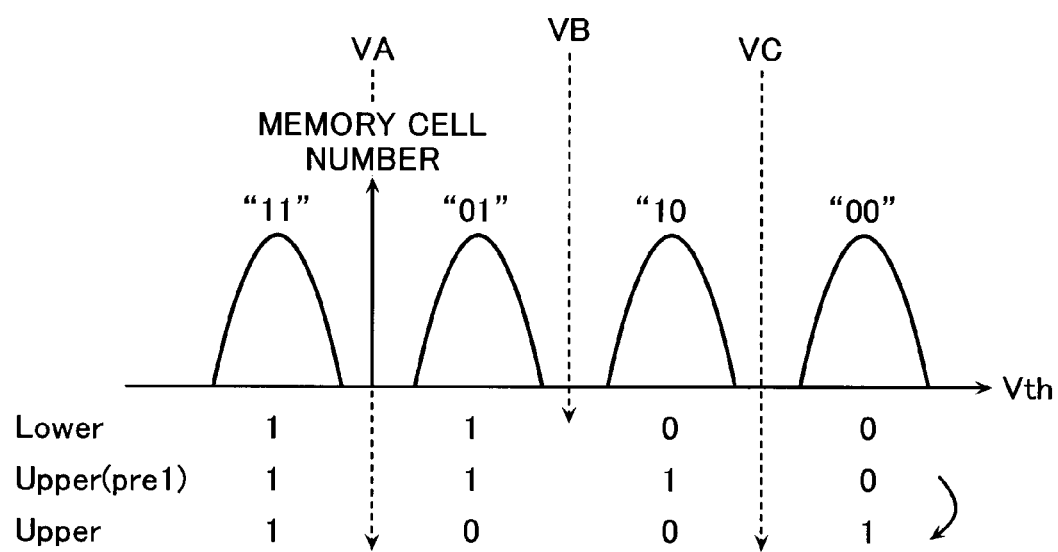
FIG. 14 is a schematic diagram showing a relationship between lower page data Lower and upper page data Upper.

The data held at TDC after the above-described operation has been performed is output outside as upper page data Upper, after it is transferred to SDC. The relation between Data Upper (pre1) and the upper page data Upper is shown in FIG. 14. The lower page data Lower and the upper page data Upper are read in the above process, thereby readout of 4-value data being completed.

In this memory unit 100, soft-value data is read by the method described above, and the likelihood value representing a certainty of plural-bit data is calculated by the likelihood calculation circuit 10 based on this soft-value data. An error correction is performed in the error correction circuit 11 using this likelihood value.

Figure 15:
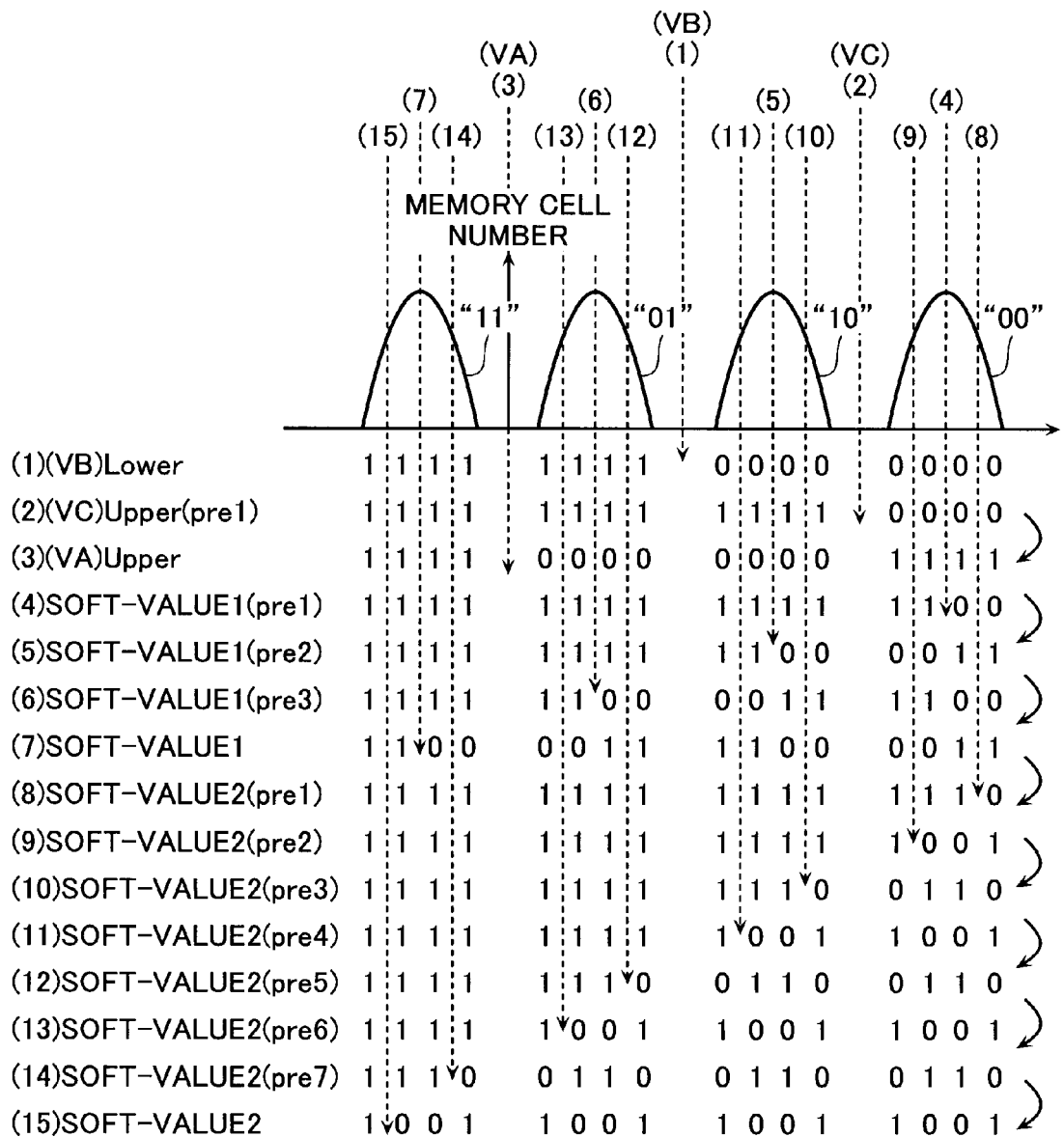
FIG. 15 illustrates a process of generating a soft-value data.

Soft-value data is generated by generating plural soft-value read voltages (4)-(15) by the word-line control circuit 6 as word-line voltages and conducting reading, as shown for example in FIG. 15. The plural soft-value read voltages (4)-(15) are between an upper limit and a lower limit of each of the threshold value distributions of data "11", "01", "10", "00". With such soft-value data, it is possible to judge whether the memory cell to be read is any one of the four data ("11", "01", "10", or "00"). In addition, it is possible to judge whether the threshold voltage of the memory cell to be read is near the center (the peak) of one of the threshold value distributions, or near the upper limit or the lower limit of one of the threshold value distributions.

When the threshold voltage is close to the upper limit or the lower limit of the threshold value distribution, it is more likely that data error occurs, compared to the case it is close to the center of the threshold value distribution. In other words, the former has a lower "certainty" of the plural-bit data (likelihood) compared to the latter. The error correction circuit 11 repeats executing error correction, based on the obtained soft-value data. The error correction is continued until all sets of 4-value data to be error-corrected in the memory areas read have been corrected to have correct values (values written in the memory cells), or the number (the number of times) of error corrections conducted has reached a predetermined iteration number. This iteration number is counted in the error-correction circuit 11.

In this FIG. 15, the soft-value read voltages (4)-(7) are near the midpoint of each of the threshold value distributions of data "11", "01", "10", and "00" (approximately middle of an upper limit and a lower limit). Moreover, the other soft-value read voltages (8)-(15) are set so that they divide each of the threshold value distributions at approximately regular intervals with the soft-value read voltage (4)-(7). That is, this can be summarized as follows:

(i) the soft-value read voltages (4), (8), and (9) are set up to divide the threshold value distribution of data "00" at approximately regular intervals;

(ii) the soft-value read voltages (5), (10), and (11) are set up to divide the threshold value distribution of data "10" at approximately regular intervals;

(iii) the soft-value read voltages (6), (12), and (13) are set up to divide the threshold value distribution of data "00" at approximately regular intervals; and (iv) the soft-value read voltages (7), (14), and (15) are set up to divide threshold value distribution of data "11" at approximately regular intervals.

This is an example in case the threshold value distributions are made into approximately Gaussian distribution forms. The present invention is not limited to this example. Each of the threshold value distributions may be divided at slightly irregular or biased intervals, depending on the form of the threshold value distributions. Moreover, the number of divisions in each of the threshold value distributions, i.e., the number of the soft-value read voltages included in each of the threshold value distributions, is not limited to three. It may be four or more.

Next, the process of generating this soft-value data is explained in detail with reference to FIG. 15.

First, as shown in FIG. 12 and FIG. 13, word line voltage is set at the following (1) to (3) in this order:
(1) a plural-bit data read voltage VB;
(2) a plural-bit data read voltage VC; and
(3) a plural-bit data read voltage VA.

Thereby, the lower page data Lower, the temporary upper page data Upper (pre1), and the upper page data Upper are read.

Suppose that the word line voltage is changed in the order of (1), (2), ..., (15). The matrix of "1" and "0" indicated in the lower half of FIG. 15 indicates threshold voltages of the memory cell, page data obtained, and a soft-value (Soft-Value 1 (prei), Soft-Value 2 (prei), Soft-Value 1, Soft-Value 2), when the word line voltage is changed as described above.

Next, the word-line voltage is set at soft-value read voltages (4), (5), (6), (7) in this order (that is, the word-line voltage is lowered in a step-like manner from higher side to lower side). The soft value read voltages (4)-(7) each has an approximately intermediate value between an upper limit and an lower limit of each threshold value distribution.

First, when the soft-value read voltage (4) is set, soft-value data Soft-Value 1 (pre1) is read. This soft-value data Soft-Value 1 (pre1) is read out as data "0", only when memory cells with a threshold voltage larger than the right half of the threshold value distribution of data "00" is read. Otherwise, it is read out as data "1". This soft-value data Soft-Value 1 (pre1) is read and temporarily held at TDC, and held at DDCA via PDC.

Next, when the soft-value read voltage (5) is set, soft-value data Soft-Value 1 (pre2) is read. This soft-value data Soft-Value 1 (pre2) is read out as data "0", only when memory cells with a threshold voltage larger than the right half of the threshold value distribution of data "10" is read. Otherwise, it is read out as data "1", and is held at TDC. However, the soft-value data Soft-Value 1 (pre1) is held at DDCA. If the soft-value data Soft-Value 1 (pre1) held at DDCA is "0", the data held at TDC is forced to be inverted (reversed) to "1" (refer to the arrow in FIG. 15). That is, when the soft-value read voltage is lowered in a step-like manner, and neither a first soft-value read voltage nor a second soft-value read voltage smaller than the first soft-value read voltage by one step turns on the memory cell, the data obtained by the second soft-value read voltage is inverted. The inverted value is regarded as the soft-value.

Similarly, the soft-value read voltage (6) and (7) are applied as a word line voltage. When the previous Soft-Value 1 (prei) is "0", the data is inverted.

The data generated by the soft-value read voltage (7) is the Soft-Value 1. It is used for likelihood calculation in the likelihood calculation circuit 10 with the Soft-Value 2 described later.

Then, the word line voltage is set at soft-value read voltages (8) to (15) in this order (that is, the word-line voltage is lowered in a step-like manner from higher side to lower side). Data is inverted when the previous soft-value held at DDCA is "0", just like in the case of (4)-(7). The Soft-Value 2 generated by applying the soft-value read voltage (15) as word line voltage is used in the likelihood calculation circuit 10 for likelihood calculation with the Soft-Value 1.

The error correction circuit 11 repeats correction in a try-and-error manner based on the likelihood value calculated in the likelihood calculation circuit 10 using the upper page data UPPER, lower page data LOWER, the Soft-Value 1 and the Soft-Value2. Moreover it counts an iteration number and outputs iteration number data.

When the iteration number comparator circuit 12 judges that the iteration number is larger than a certain threshold value, it is judged that the number of error corrections conducted is close to a limit of correctable error. Then, a refresh command for a refresh operation of memory cells is output. The I/O control circuit 6 outputs this refresh command to the control signal generation circuit 7 through the data input-output buffer 5. Thereby, a refresh operation is performed for a block judged to be close to the correctable error limit in the memory cell array 1.

As described above, in this embodiment, a timing of a refresh operation to the memory area (a block) judged to be close to the correctable error limit can be controlled, based on the iteration number, without counting the number of error corrections. The iteration number is more reliable as information than the number of error corrections.

As a result, a refresh operation can be performed before having errors more than the limit correctable by an error-correction circuit. Therefore, a frequency of generating errors more than the limit correctable by an error-correction circuit can be suppressed to a practically satisfactory extent.

Second Embodiment

Figure 16:
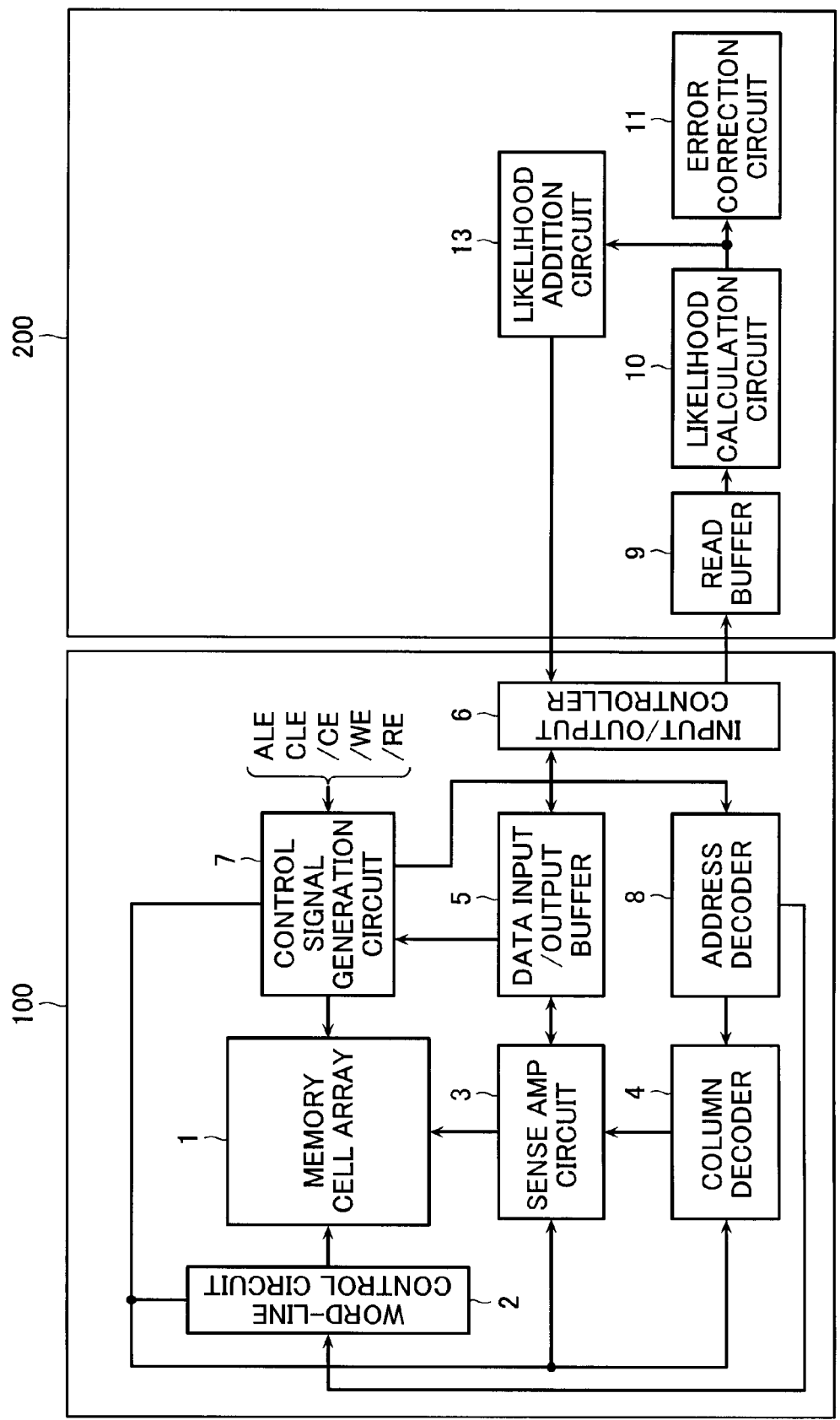
FIG. 16 is a schematic diagram of a configuration of a NAND cell type flash memory according to a second embodiment of the present invention.

Next, the second embodiment of the present invention is explained with reference to FIG. 16. Since the same reference numerals are given to the same components as those in the first embodiment, the detailed explanation thereof is omitted hereinbelow.

This embodiment differs from the first embodiment in that it replaces the iteration number comparator circuit 12 with a likelihood addition circuit 13. The likelihood addition circuit 13 is an example of the refresh control circuit controlling a refresh operation of a memory cell.

This likelihood addition circuit 13 adds the absolute values of the likelihood values calculated in the likelihood calculation circuit 10. Then, it calculates a sum thereof for every block as a unit of error correction.

When the sum is smaller than the predetermined reference value, the refresh command is issued for the block in which error correction was conducted (read most recently). It means that the block has a lot of data with a low reliability, and it is close to the limit correctable.

Also in this embodiment, a timing of a refresh operation to the memory area judged to be close to the correctable error limit can be controlled, based on the sum of the absolute values of the likelihood values, without counting the number of error corrections. The sum of the absolute values of the likelihood values is more reliable as information than the number of error corrections.

Moreover, this embodiment enables a timing of a refresh to be controlled without executing error correction by the error-correction circuit 11. Therefore, it becomes possible to shorten a cycle of a refresh operation as compared to the first embodiment. As a result, a refresh operation can be performed before having errors more than the limit correctable by an error-correction circuit. Therefore, a frequency of generating errors more than the limit correctable by an error-correction circuit can be suppressed to a practically satisfactory extent.

Third Embodiment

Figure 17:
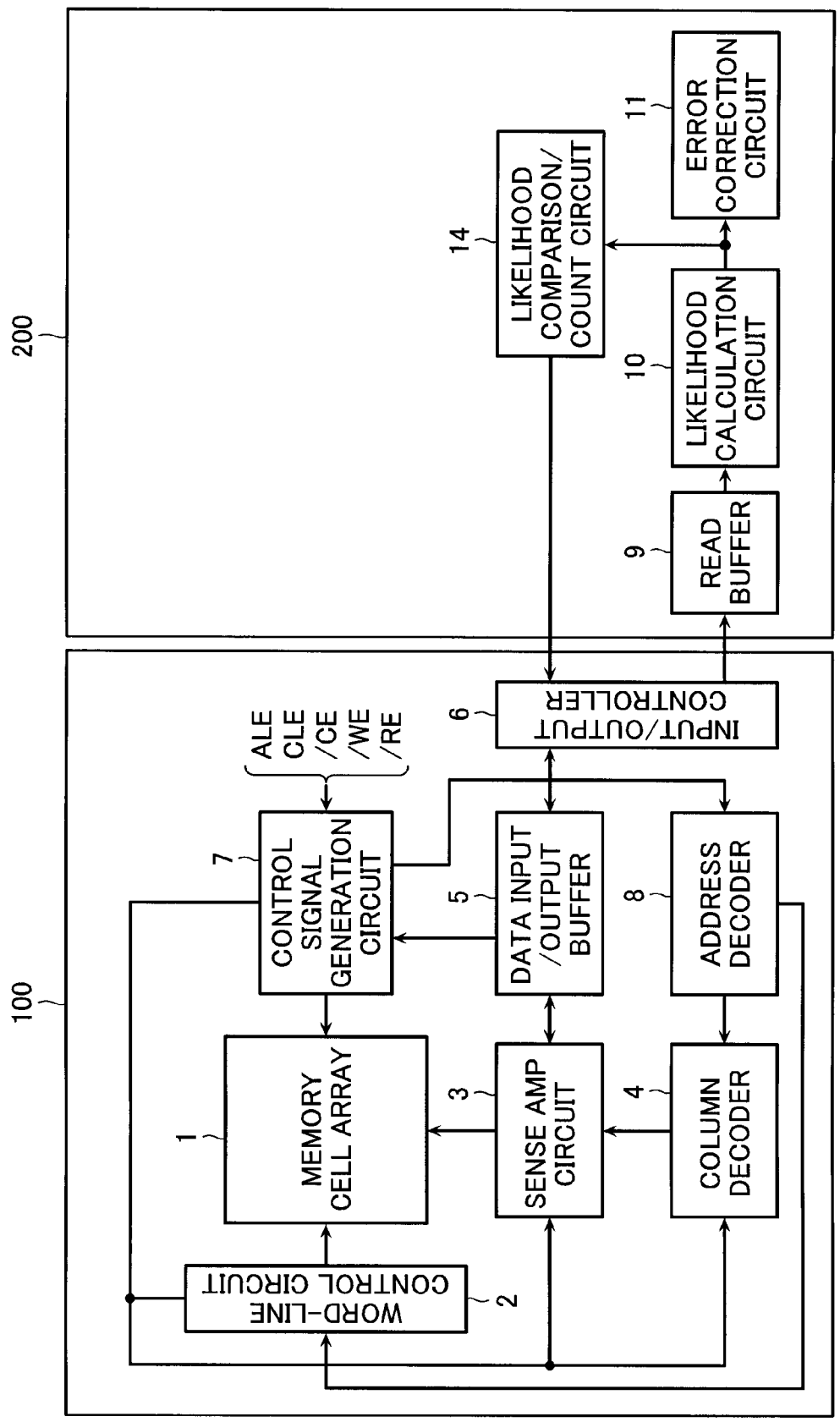
FIG. 17 is a schematic diagram of a configuration of a NAND cell type flash memory according to a third embodiment of the present invention.

Next, the third embodiment of the present invention is explained with reference to FIG. 17. Since the same reference numerals are given to the same components as those in the first embodiment, the detailed explanation thereof is omitted hereinbelow. This embodiment differs from the first embodiment in that it replaces the iteration number comparator circuit 12 with a likelihood comparator/counter circuit 14. This likelihood comparator/counter circuit 14 is an example of the refresh control circuit controlling a refresh operation of a memory cell.

The likelihood comparator/counter circuit 14 has a function of comparing an absolute value of the likelihood value per input bit with the predetermined reference value, and counting the number of likelihood values smaller than the reference value.

When the counted result is more than the predetermined reference value, a refresh command is issued for the memory area in which error correction was conducted (read most recently). It means that the area has a lot of data with a low reliability, and it is close to the limit correctable.

Also in this embodiment, a timing of a refresh operation to the memory area judged to be close to the correctable error limit can be controlled, based on the number of likelihood values with small absolute values, without counting the number of error corrections. The number of likelihood values with small absolute values is more reliable as information than the number of error corrections.

Moreover, this embodiment enables a timing of a refresh to be controlled without executing error correction by the error-correction circuit 11. Therefore, it becomes possible to shorten a cycle of a refresh operation as compared to the first embodiment. As a result, a refresh operation can be performed before having errors more than the limit correctable by an error-correction circuit. Therefore, a frequency of generating errors more than the limit correctable by an error-correction circuit can be suppressed to a practically satisfactory extent.

Fourth Embodiment

Figure 18:
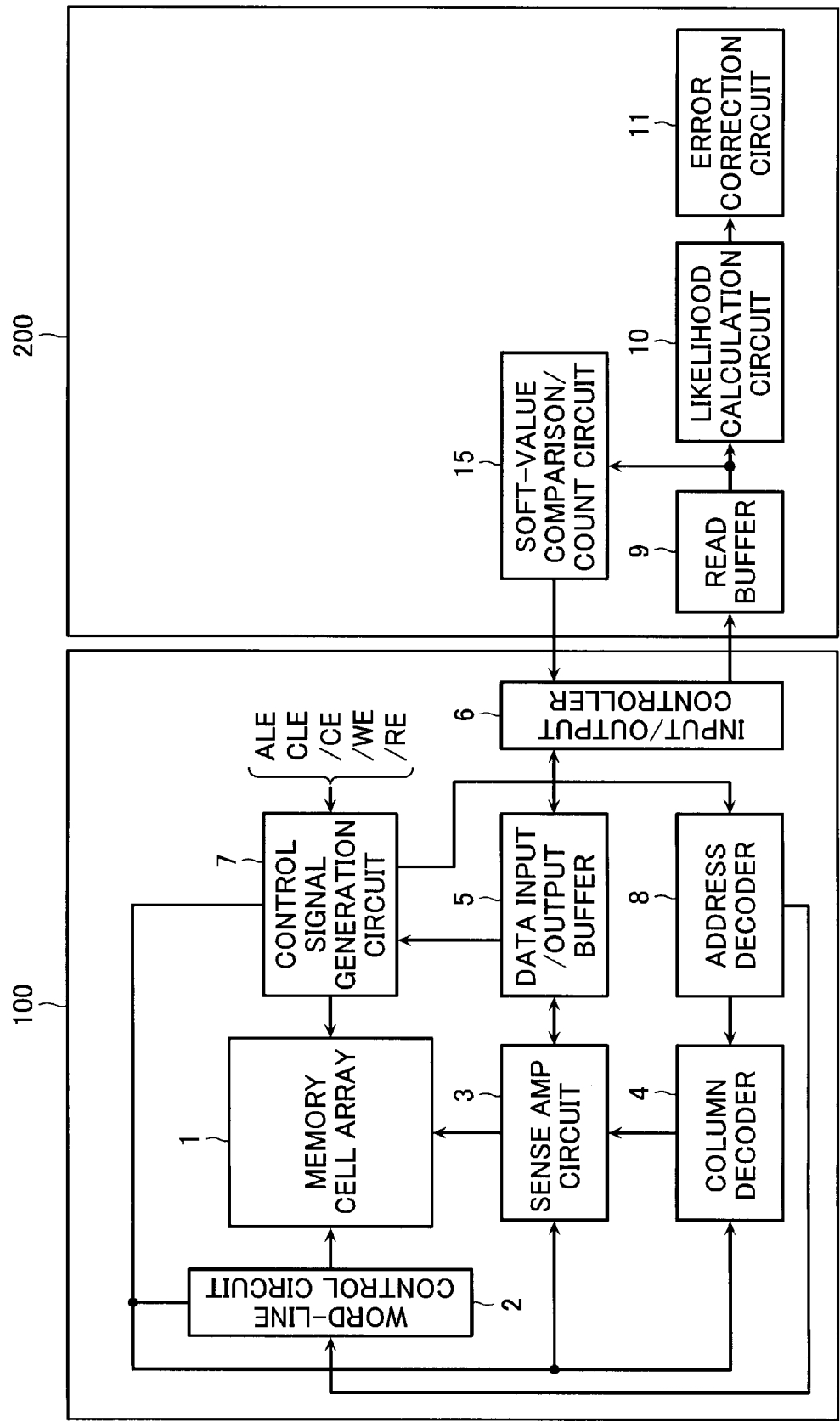
FIG. 18 is a schematic diagram of a configuration of a NAND cell type flash memory according to a fourth embodiment of the present invention.
Figure 19:
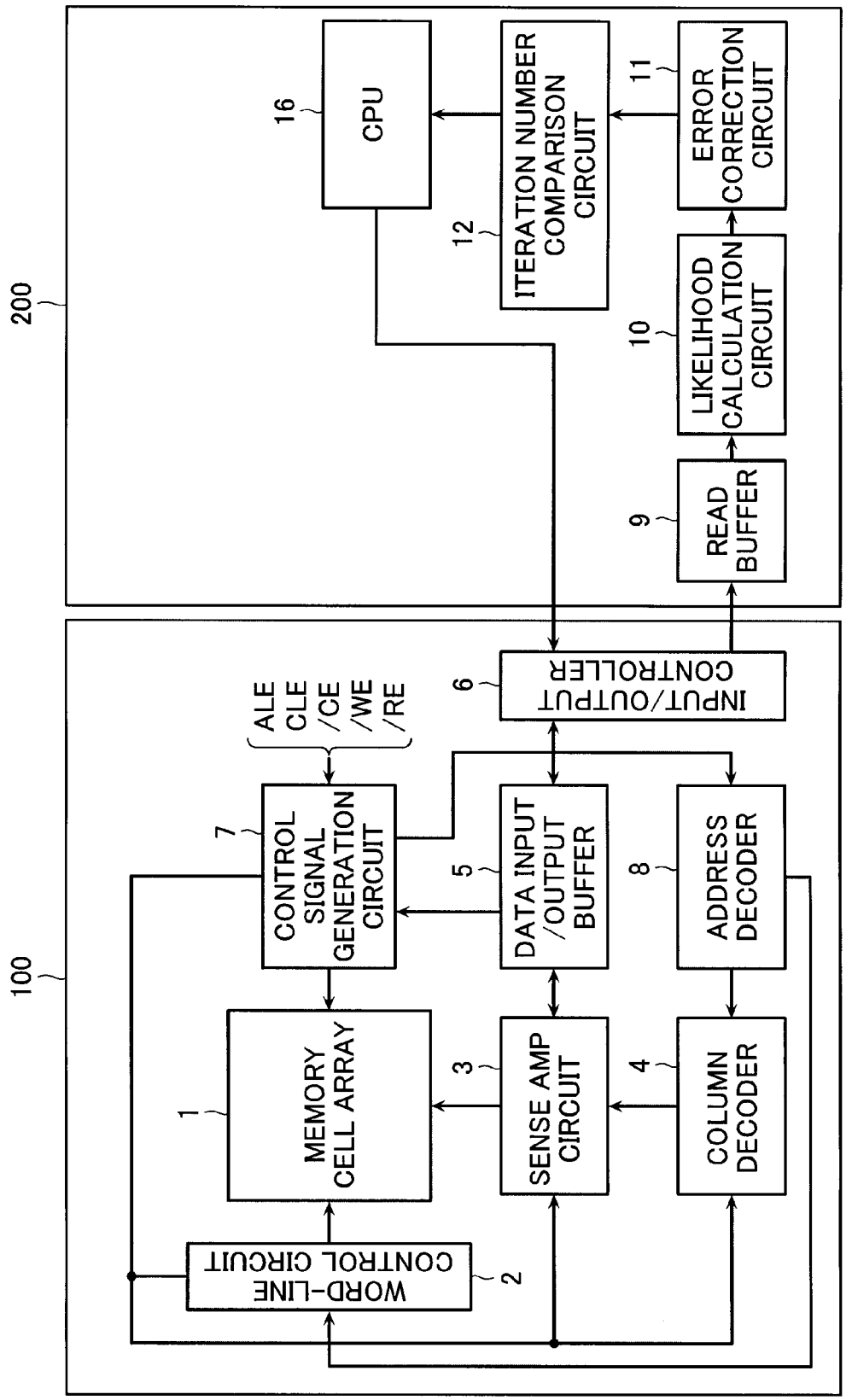
FIG. 19 is a schematic diagram of a configuration of a NAND cell type flash memory according to a modification of the embodiments of the present invention.
Figure 20:
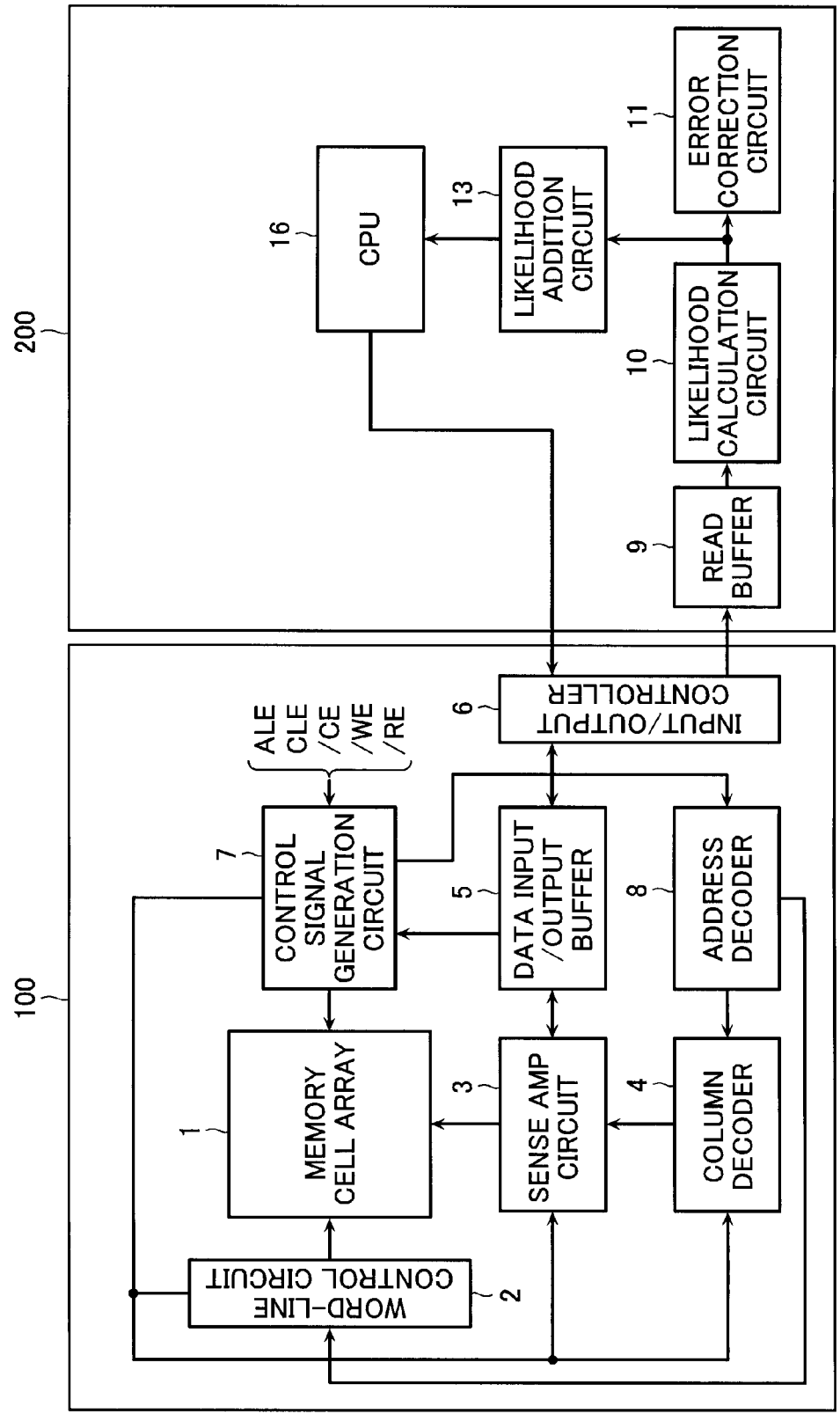
FIG. 20 is a schematic diagram of a configuration of a NAND cell type flash memory according to a modification of the embodiments of the present invention.
Figure 21:
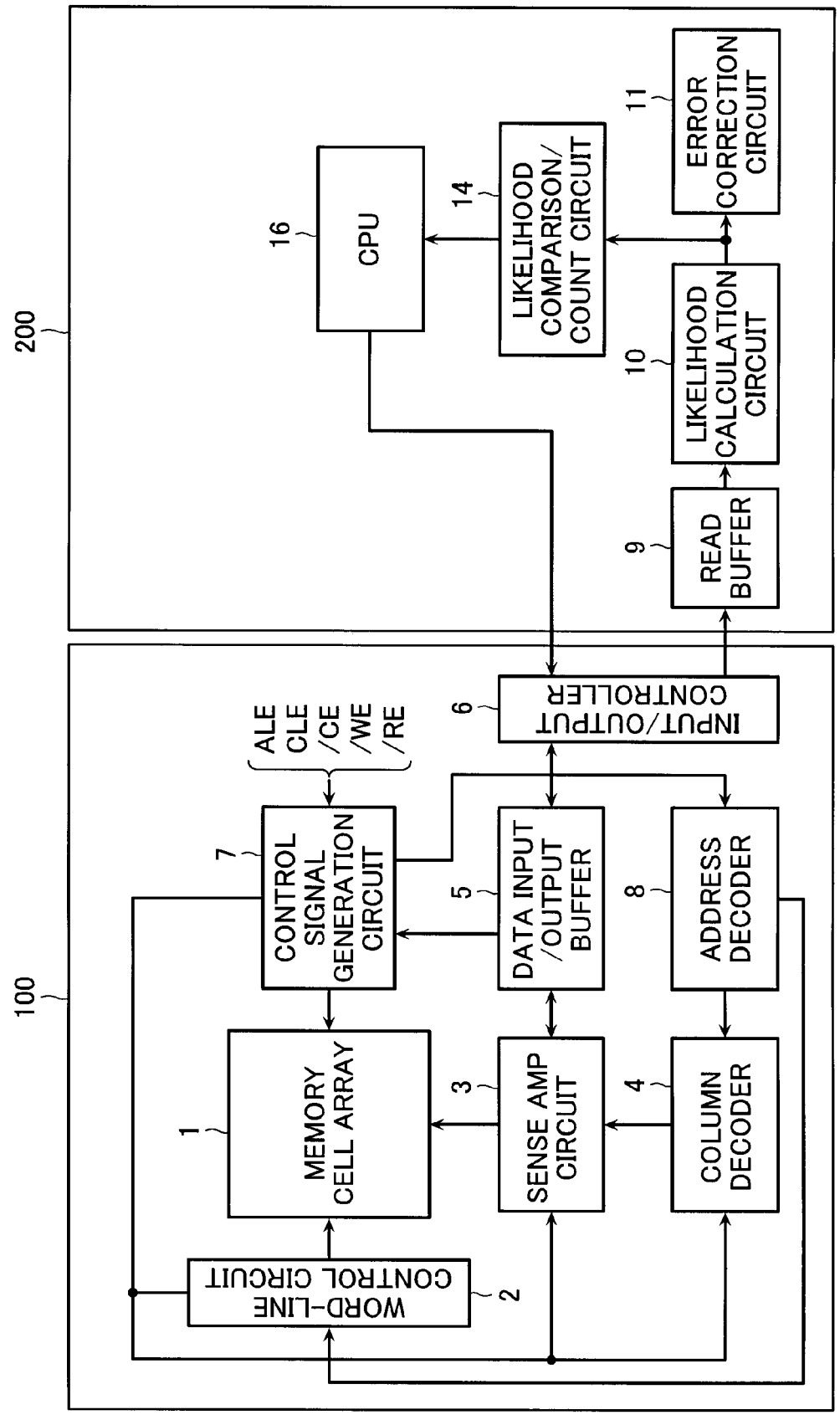
FIG. 21 is a schematic diagram of a configuration of a NAND cell type flash memory according to a modification of the embodiments of the present invention.
Figure 22:
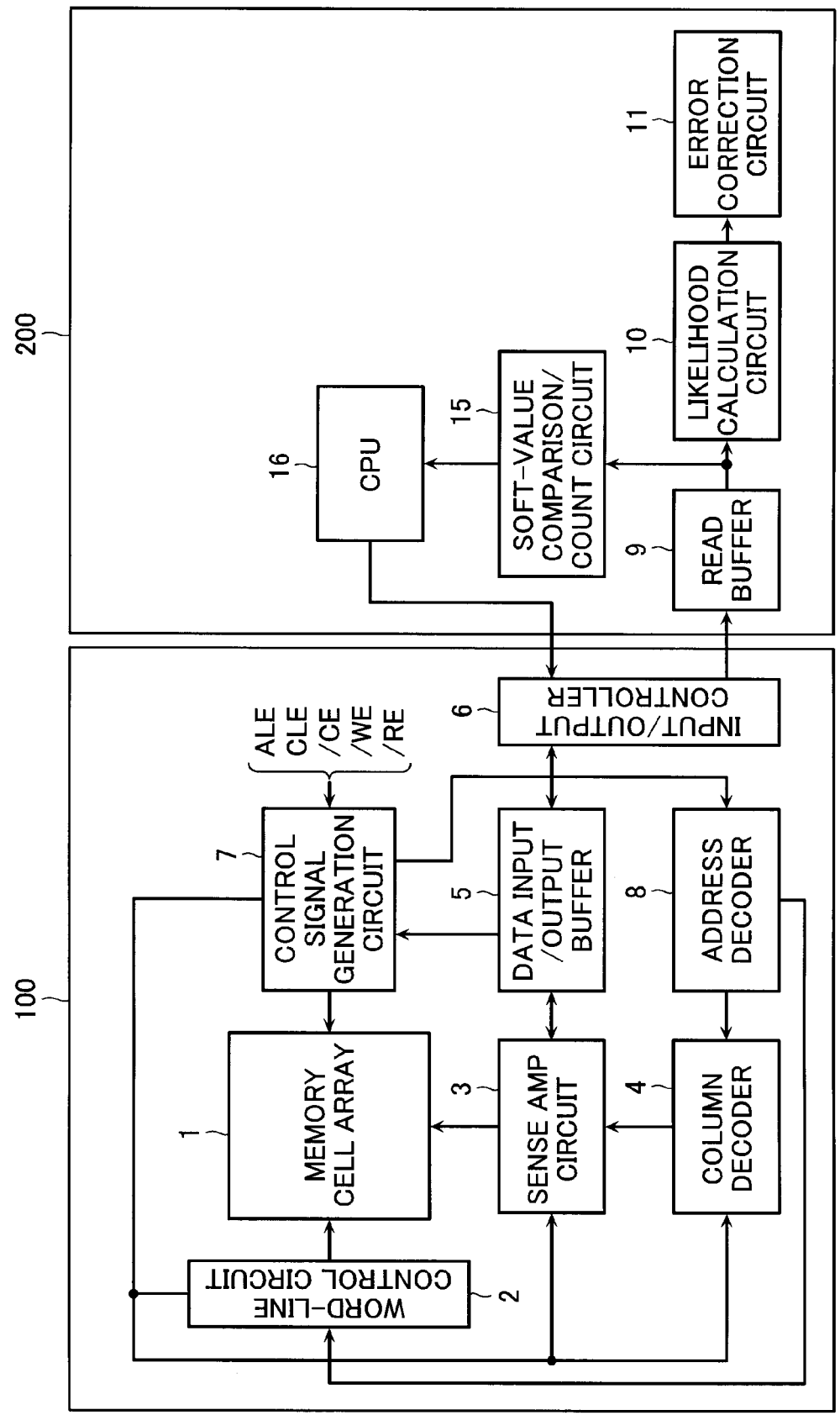
FIG. 22 is a schematic diagram of a configuration of a NAND cell type flash memory according to a modification of the embodiments of the present invention.

Next, the fourth embodiment of the present invention is explained with reference to FIG. 18. Since the same reference numerals are given to the same components as those in the first embodiment, the detailed explanation thereof is omitted hereinbelow. This embodiment differs from the first embodiment in that it replaces the iteration number comparator circuit 12 with a soft-value comparator/count circuit 15.

This soft-value comparator/count circuit 15 is an example of the refresh control circuit controlling a refresh operation of a memory cell.

The soft-value comparator/count circuit 15 has a function of comparing soft-value data per cell input from the read buffer 9 with the predetermined reference value, and counting the number of soft-value data corresponding to the likelihood value with a small absolute value.

when the number is more than the predetermined reference value, a refresh command is issued for the memory area in which error correction was conducted (read most recently). It means that the area has a lot of data with a low reliability, and it is close to the limit correctable.

In this embodiment, a timing of a refresh operation to the memory area judged to be close to correctable error limit can be controlled, based on the number of soft-value data including a likelihood value with a small absolute value, without counting the number of error corrections. The number of soft-value data including a likelihood value with a small absolute value is more reliable as information than the number of error corrections.

Moreover, this embodiment enables a timing of a refresh to be controlled without executing error correction by the error-correction circuit 11. Therefore, it becomes possible to shorten a cycle of a refresh operation as compared to the first embodiment. As a result, a refresh operation can be performed before having errors more than the limit correctable by an error-correction circuit. Therefore, a frequency of generating errors more than the limit correctable by an error-correction circuit can be suppressed to a practically satisfactory extent.

Although the embodiments of the present invention have been explained, the present invention is not limited to this. Various modifications, additions and the like are possible without departing from the spirit of the present invention. For example, although the above-mentioned embodiments have explained 4-value data as plural-bit data as an example, it is needless to say that the present invention is not limited to this, and it is applicable to N-value data (N is one or more integers) such as 8 or 16.

Moreover, as shown in FIGS. 19-22, outputs from the iteration number comparator circuit 12, the likelihood addition circuit 13, and the likelihood comparator/counter circuit 14, which are explained in the embodiments, may be input to a CPU 16. A refresh operation may be controlled under instruction from the CPU 16.

Figure 23:
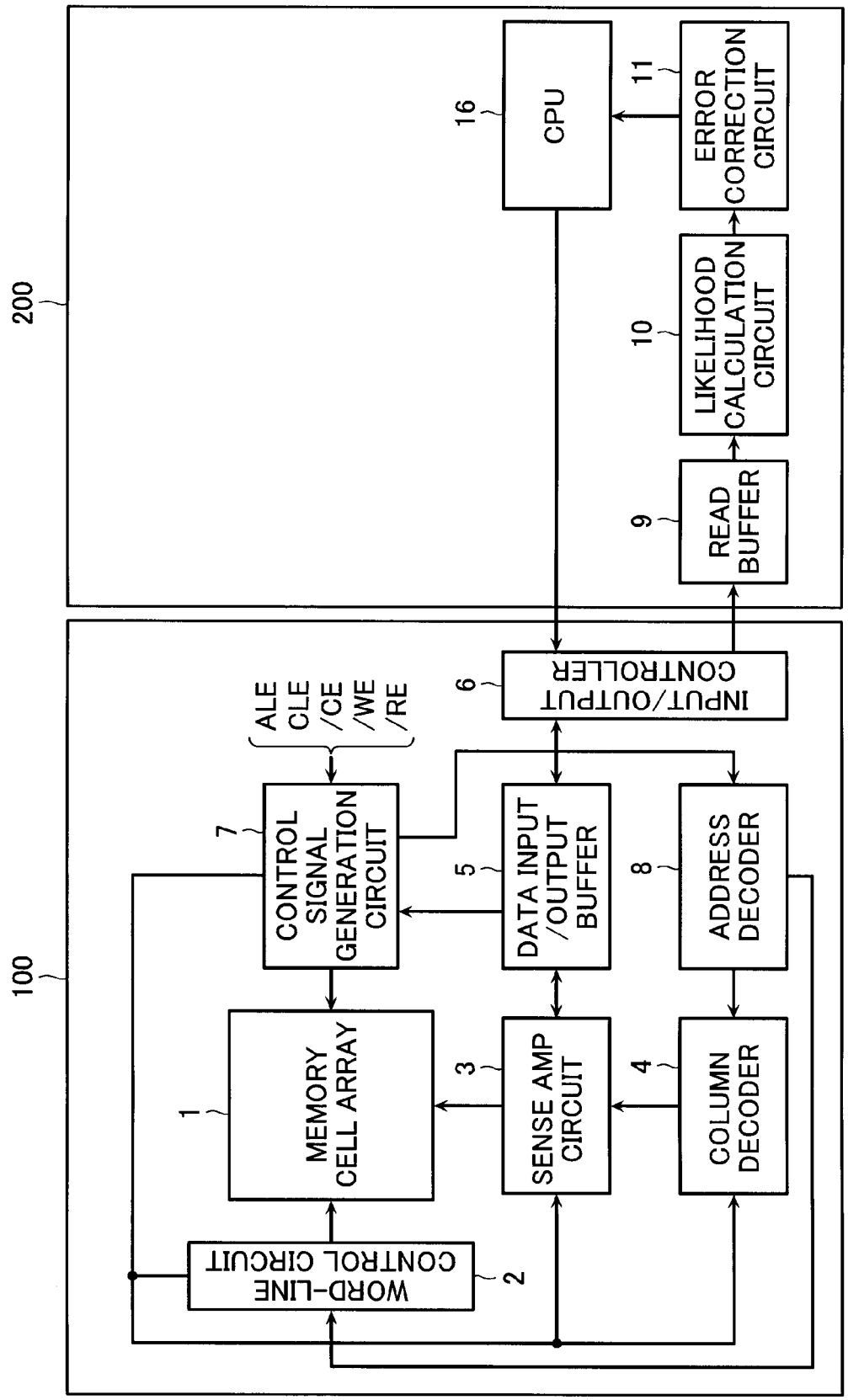
FIG. 23 is a schematic diagram of a configuration of a NAND cell type flash memory according to a modification of the embodiments of the present invention.

Moreover, as shown in FIG. 23, it is also possible to control a refresh operation by outputting a iteration number from the error-correction circuit 11, inputting the iteration number into the CPU 16, and judging this iteration number by the CPU 16.

Moreover, although each of the embodiments explained an example using either one of the iteration number comparator circuit 12, the likelihood addition circuit 13 or likelihood comparator/counter circuit 14. However, it is also possible to prepare these circuits complexly in one memory device to control a refresh operation.

What is claimed is:

1. A non-volatile semiconductor storage device comprising:
   a memory cell array comprising a plurality of memory cells enabled to store multi-value data by differences of threshold voltages, the memory cells being arranged along a plurality of bit-lines and a plurality of word-lines;
   a sense amplifier circuit connected to the bit-lines;
   a word-line control circuit controlling applying a read voltage as a word line voltage to the word line, the read voltage being larger than an upper limit of one of plural threshold voltage distributions representing the data and smaller than a lower limit of another threshold voltage distribution with higher threshold voltages than the one of the plural threshold voltage distributions, and applying a soft-value read voltage as a word line voltage to the word line, the soft-value read voltage being smaller than an upper limit of each of the plurality of the threshold voltage distributions and larger than a lower limit thereof to generate a plurality of soft-values;
   a likelihood calculation circuit calculating a likelihood value of data stored in the memory cell based on the soft-value;
   an error correction circuit executing data error correction for the data read from the memory cell based on the likelihood value; and
   a refresh control circuit controlling a timing of a refresh operation for the memory cell based on the soft-value or the likelihood value.

2. The non-volatile semiconductor storage device according to claim 1, wherein the refresh control circuit controls a timing of the refresh operation for the memory cells based on an iteration number of a iterative decoding in the error correction circuit.

3. The non-volatile semiconductor storage device according to claim 1, wherein the refresh control circuit controls a timing of the refresh operation for the memory cells based on a sum of the absolute values of the likelihood values, each of which being for each bit in a certain memory area.

4. The non-volatile semiconductor storage device according to claim 1, wherein the refresh control circuit controls a timing of the refresh operation for the memory cells based on the number of data with a likelihood value whose absolute value is smaller than a predetermined reference value.

5. The non-volatile semiconductor storage device according to claim 1, wherein the refresh control circuit controls a timing of the refresh operation for the memory cells based on comparison result between the soft-value and a reference value.

6. The non-volatile semiconductor storage device according to claim 1, wherein the likelihood calculation circuit is configured to generate a first soft-value first by setting the soft-value read voltage at a first voltage having an approximately intermediate value of each of the threshold value distributions, and subsequently, generate a second soft-value by setting the soft-value read voltage at a second voltage having an value between the first voltage and an upper limit or a lower limit of the threshold value distribution, and calculate the likelihood value based on the first and second soft-values, and wherein the first and second soft-values are generated by lowering the first voltage or the second voltage in a step-like manner, and based on a state of data read when the first voltage or the second voltage is set at a certain value, inverting data read when the first voltage or the second voltage is set at a value lower than the certain value by one step.

7. The non-volatile semiconductor storage device according to claim 6, wherein in case data read when the first voltage or the second voltage is set at the certain value coincides with data read when the first voltage or the second voltage is set at a value lower than the certain value by one step, the data is inverted and output as the first soft-value or the second soft-value.

8. A non-volatile semiconductor storage system comprising:
   a likelihood calculation circuit calculating a likelihood value of data stored in a memory cell in a memory cell array based on the soft-value read therefrom, the memory cell array comprising a plurality of the memory cells enabled to store multi-value data by differences of threshold voltages, the memory cells being arranged along a plurality of bit-lines and a plurality of word-lines;

an error correction circuit executing data error correction for the data read from the memory cell based on the likelihood value; and a refresh control circuit controlling a timing of a refresh operation for the memory cell based on the soft-value or the likelihood value.

9. The non-volatile semiconductor storage system according to claim 8, wherein the refresh control circuit controls a timing of the refresh operation for the memory cells based on a iteration number of an iterative decoding in the error correction circuit.

10. The non-volatile semiconductor storage system according to claim 8, wherein the refresh control circuit controls a timing of the refresh operation for the memory cells based on a sum of the absolute values of the likelihood values, each of which being for each bit in a certain memory area.

11. The non-volatile semiconductor storage system according to claim 8, wherein the refresh control circuit controls a timing of the refresh operation for the memory cells based on the number of data with a likelihood value whose absolute value is smaller than a predetermined reference value.

12. The non-volatile semiconductor storage system according to claim 8, wherein the refresh control circuit controls a timing of the refresh operation for the memory cells based on comparison result between the soft-value and a reference value.

13. The non-volatile semiconductor storage system according to claim 8, wherein the likelihood calculation circuit is configured to generate a first soft-value first by setting the soft-value read voltage at a first voltage having an approximately intermediate value of each of the threshold value distributions, and subsequently, generate a second soft-value by setting the soft-value read voltage at a second voltage having an value between the first voltage and an upper limit or a lower limit of the threshold value distribution, and calculate the likelihood value based on the first and second soft-values, and wherein the first and second soft-values are generated by lowering the first voltage or the second voltage in a step-like manner, and, based on a state of data read when the first voltage or the second voltage is set at a certain value, inverting data read when the first voltage or the second voltage is set at a value lower than the certain value by one step.

14. The non-volatile semiconductor storage device according to claim 13, wherein in case data read when the first voltage or the second voltage is set at the certain value coincides with data read when the first voltage or the second voltage is set at a value lower than the certain value by one step, the data is inverted and output as the first soft-value or the second soft-value.

* * * * *